US011682662B2

(12) United States Patent
Oka et al.

(10) Patent No.: US 11,682,662 B2
(45) Date of Patent: Jun. 20, 2023

(54) METHOD OF MANUFACTURING LIGHT-EMITTING ELEMENT

(71) Applicant: NICHIA CORPORATION, Anan (JP)

(72) Inventors: Yuta Oka, Tokushima (JP); Nami Abe, Anan (JP)

(73) Assignee: NICHIA CORPORATION, Anan (JP)

(*) Notice: Subject to any disclaimer, the term of this patent is extended or adjusted under 35 U.S.C. 154(b) by 0 days.

(21) Appl. No.: 16/669,043

(22) Filed: Oct. 30, 2019

(65) Prior Publication Data

US 2020/0066700 A1 Feb. 27, 2020

Related U.S. Application Data

(62) Division of application No. 15/826,521, filed on Nov. 29, 2017, now Pat. No. 10,497,686.

(30) Foreign Application Priority Data

Nov. 30, 2016 (JP) .............................. JP2016-233068

(51) Int. Cl.
*H01L 25/16* (2023.01)
*H01L 27/02* (2006.01)
(Continued)

(52) U.S. Cl.
CPC ........ *H01L 25/167* (2013.01); *H01L 27/0248* (2013.01); *H01L 29/866* (2013.01);
(Continued)

(58) Field of Classification Search
CPC combination set(s) only.
See application file for complete search history.

(56) References Cited

U.S. PATENT DOCUMENTS 9,666,567 B2 * 5/2017 Nagano ................. H01L 25/167
2005/0090091 A1 4/2005 Ishikawa et al.
(Continued)

FOREIGN PATENT DOCUMENTS

JP 2005-135932 A 5/2005
JP 2012-015437 A 1/2012
(Continued)

OTHER PUBLICATIONS

Non-Final Office Action on U.S. Appl. No. 15/826,521 dated Apr. 11, 2019.
(Continued)

*Primary Examiner* — Tony Tran
(74) *Attorney, Agent, or Firm* — Foley & Lardner LLP

(57) ABSTRACT

A method of manufacturing a light emitting device includes: placing a light-emitting element above a light-transmitting portion of a first resin layer; placing a protective element above the first resin layer or a first surface of the light-emitting element; forming a second resin layer on the first resin layer so as to cover an entirety of the light-emitting element and an entirety of the protective element; removing a portion of the second resin layer such that an anode and a cathode of the light-emitting element and a first electrically-conductive structure and a second electrically-conductive structure of the protective element are exposed from the second resin layer; and forming a first electrode, which is electrically connected to the anode and the first electrically-conductive structure, and a second electrode, which is electrically connected to the cathode and the second electrically-conductive structure.

19 Claims, 29 Drawing Sheets

(51) Int. Cl.
- *H01L 29/866* (2006.01)
- *H01L 33/50* (2010.01)
- *H01L 33/58* (2010.01)
- *H01L 33/62* (2010.01)
- *H01L 33/60* (2010.01)
- *H01L 33/52* (2010.01)

(52) U.S. Cl.
CPC ............ *H01L 33/502* (2013.01); *H01L 33/58* (2013.01); *H01L 33/507* (2013.01); *H01L 33/52* (2013.01); *H01L 33/60* (2013.01); *H01L 33/62* (2013.01); *H01L 2224/04105* (2013.01); *H01L 2224/16245* (2013.01); *H01L 2224/32225* (2013.01); *H01L 2224/73267* (2013.01); *H01L 2933/0041* (2013.01); *H01L 2933/0058* (2013.01); *H01L 2933/0066* (2013.01)

(56) References Cited

U.S. PATENT DOCUMENTS

| | | | |
|---|---|---|---|
| 2012/0032322 A1* | 2/2012 | Lin | H01L 24/05 257/737 |
| 2012/0138974 A1 | 6/2012 | Yoo et al. | |
| 2013/0299861 A1* | 11/2013 | Qi | H01L 33/36 257/98 |
| 2015/0228872 A1 | 8/2015 | Nagano | |
| 2015/0249072 A1* | 9/2015 | Herrmann | H01L 23/60 257/99 |
| 2016/0093781 A1 | 3/2016 | Tamaki et al. | |
| 2016/0322540 A1 | 11/2016 | Moran et al. | |
| 2017/0227169 A1* | 8/2017 | Jiang | F21K 9/235 |

FOREIGN PATENT DOCUMENTS

| | | |
|---|---|---|
| JP | 2012-124485 A | 6/2012 |
| JP | 2012-138454 A | 7/2012 |
| JP | 2013-219397 A | 10/2013 |
| JP | 2014-026993 A | 2/2014 |
| JP | 2014-086630 A | 5/2014 |
| JP | 2015-153844 A | 8/2015 |
| JP | 2016-015356 A | 1/2016 |
| JP | 2016-058689 A | 4/2016 |
| JP | 2016-072471 A | 5/2016 |
| JP | 2016-086111 A | 5/2016 |
| JP | 2016-119402 A | 6/2016 |
| JP | 2017-502524 A | 1/2017 |
| KR | 10-0769720 B1 | 10/2007 |

OTHER PUBLICATIONS

Notice of Allowance on U.S. Appl. No. 15/826,521 dated Aug. 6, 2019.

* cited by examiner

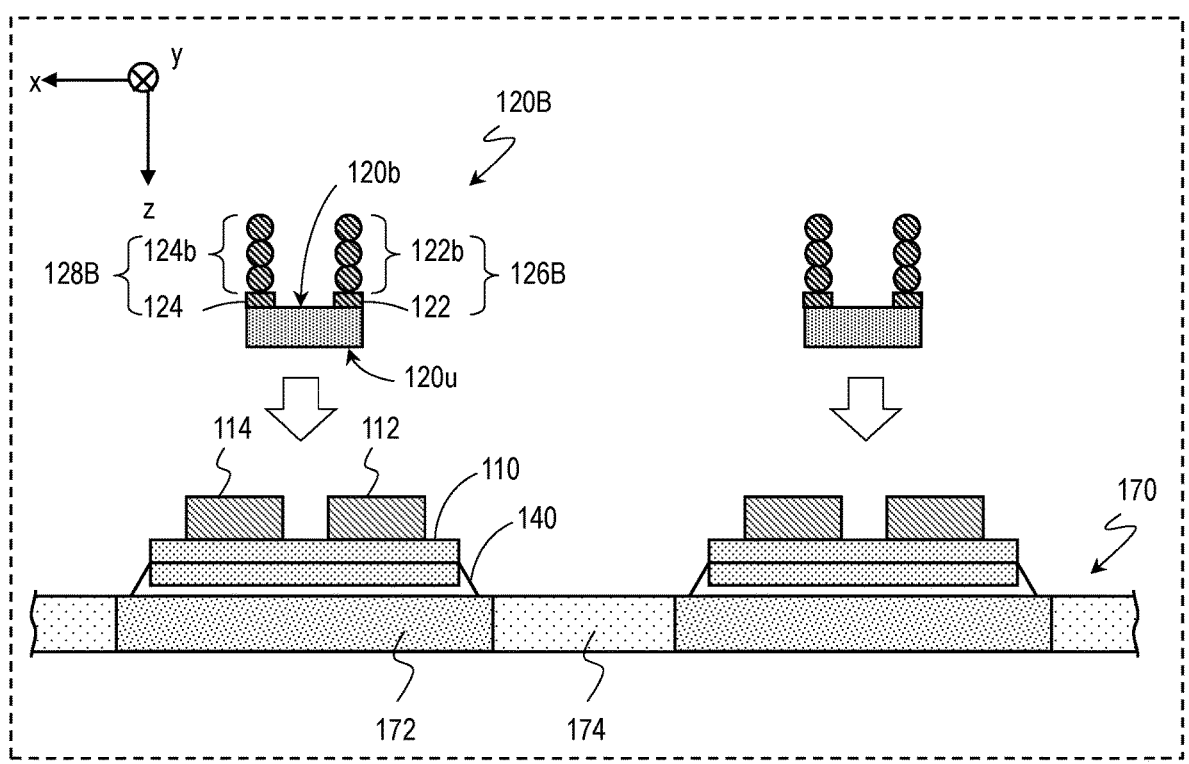

METHOD OF MANUFACTURING LIGHT-EMITTING ELEMENT

CROSS-REFERENCE TO RELATED APPLICATION

This application is a divisional of U.S. patent application Ser. No. 15/826,521, filed Nov. 29, 2017, which claims priority to Japanese Patent Application No. 2016-233068, filed on Nov. 30, 2016, the disclosures of which are hereby incorporated by reference in their entireties.

BACKGROUND

The present disclosure relates to a method of manufacturing a light-emitting element.

Semiconductor light-emitting elements such as light-emitting diodes (LED) may be used together with a protective element for preventing damage due to electrostatic discharge. For example, Korean Registered Patent No. 10-0769720 describes a structure where an LED chip and a protective element are placed in a recess of a package, and the LED chip and the protective element are connected with positive and negative lead electrodes exposed in the recess, respectively. Japanese Laid-Open Patent Publication No. 2014-026993 describes an LED module in which an LED and a voltage-regulator diode are connected at the same surface of a ceramic substrate. As described in Korean Registered Patent No. 10-0769720 and Japanese Laid-Open Patent Publication No. 2014-026993, when a protective element is used together with a semiconductor light-emitting element, electrodes are disposed on a supporting element such as a substrate, and each of the protective element and the semiconductor light emitting element is electrically connected to a respective one of the electrodes on the substrate.

SUMMARY

However, in the method of forming the package of the semiconductor light-emitting element in which each of the semiconductor light-emitting element and the protective element is connected to a respective one of the electrodes on the supporting element such as a substrate, it is necessary to form an electrical conduction structure on or in the substrate. When such a configuration is employed, each of the supporting element and/or the electrodes tends to have a complicated structure due to electrical connection. In other words, the manufacturing process may be complicated.

In one embodiment of the present disclosure, a method of manufacturing a light emitting device includes: placing, on a supporting layer, a light-emitting element having a first surface and a second surface that is opposite to the first surface such that the first surface faces the supporting layer, the light emitting element including an anode and a cathode on the first surface thereof; placing, on the supporting layer, a protective element having a third surface such that the third surface faces the supporting layer, the protective element including a first terminal and a second terminal on a third surface side; placing a protecting layer above the second surface of the light-emitting element; covering at least a lateral portion of the light-emitting element and a lateral portion of the protecting layer by a resin composition; curing the resin composition; removing the supporting layer to expose the anode, the cathode, the first terminal, and the second terminal; and forming a first electrode, which is electrically connected to the anode and the first terminal, and a second electrode, which is electrically connected to the cathode and the second terminal.

According to certain embodiments of the present disclosure, a light-emitting device can be provided that can be easily mounted to a wiring board or the like while avoiding complicating the manufacturing process.

BRIEF DESCRIPTION OF THE DRAWINGS

FIG. 26 is a schematic cross-sectional view for illustrating the light-emitting device manufacturing method of the second embodiment of the present disclosure.

DETAILED DESCRIPTION

Figure 1:
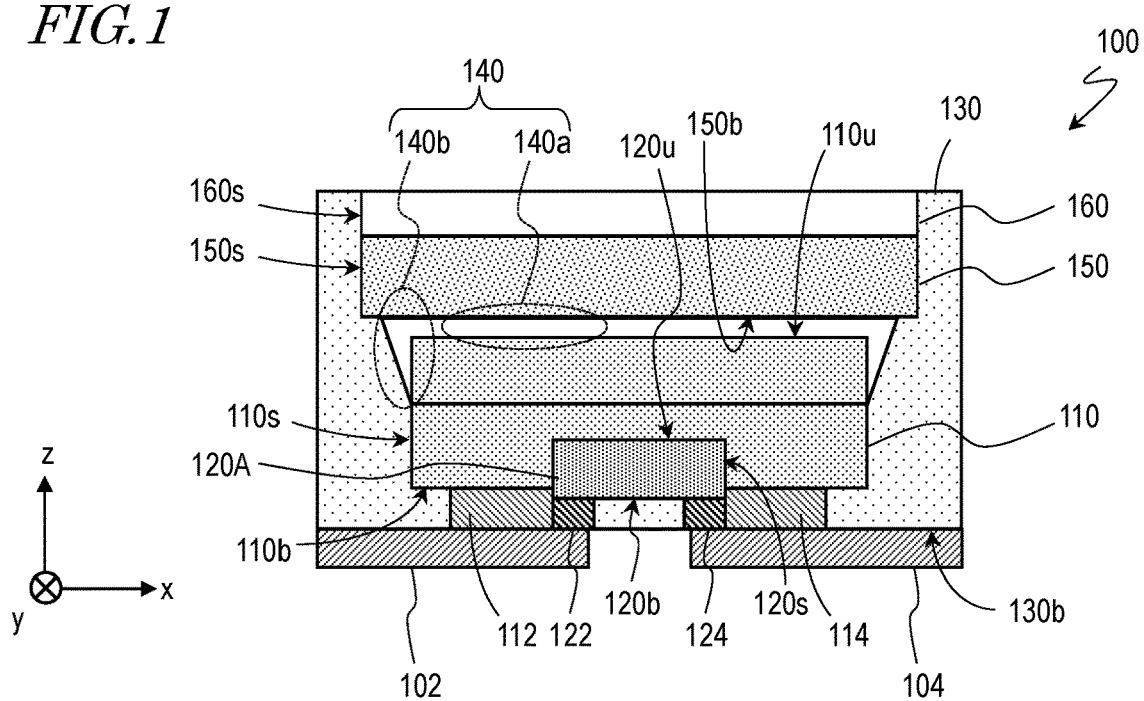
FIG. 1 is a schematic cross-sectional view showing an exemplary configuration of a light-emitting device obtained by a method of manufacturing according to a first embodiment of the present disclosure.

Hereinafter, embodiments of the present disclosure are described in detail with reference to the drawings. The embodiments described below are examples, and the configuration of the light-emitting device and manufacturing method thereof are not limited to the embodiments described below. For example, values, shapes, materials, steps, the order of steps, etc., which are described in embodiments in the below, are examples, and various modifications thereto may be made so long as no technical discrepancy arises.

In the description below, terms that indicate specific directions or positions (e.g., "upper", "lower", "right", "left", and other terms including such terms) may be used. Such terms are used for clear understanding of relative directions or positions in the referred drawings. So long as the relationship of relative directions or positions indicated by terms such as "upper", "lower", etc., in the referred drawings is identical, arrangement of components in drawings other than those in the present disclosure or products corresponding to the present disclosure may not be the same as that shown in the drawings referred in the present disclosure. In the description below, components that have substantially the same function are indicated by a common reference numeral, and the description thereof may be omitted. To avoid excessively complicated drawings, some components may not be shown in the drawings. The size or positional relationship of components shown in the drawings may be exaggerated for ease of understanding. The sizes of components in a real light-emitting device, or the relative sizes of the components in the real light-emitting device, may not be reflected in the drawings.

Exemplary Configuration of Light-Emitting Device

Figure 2:
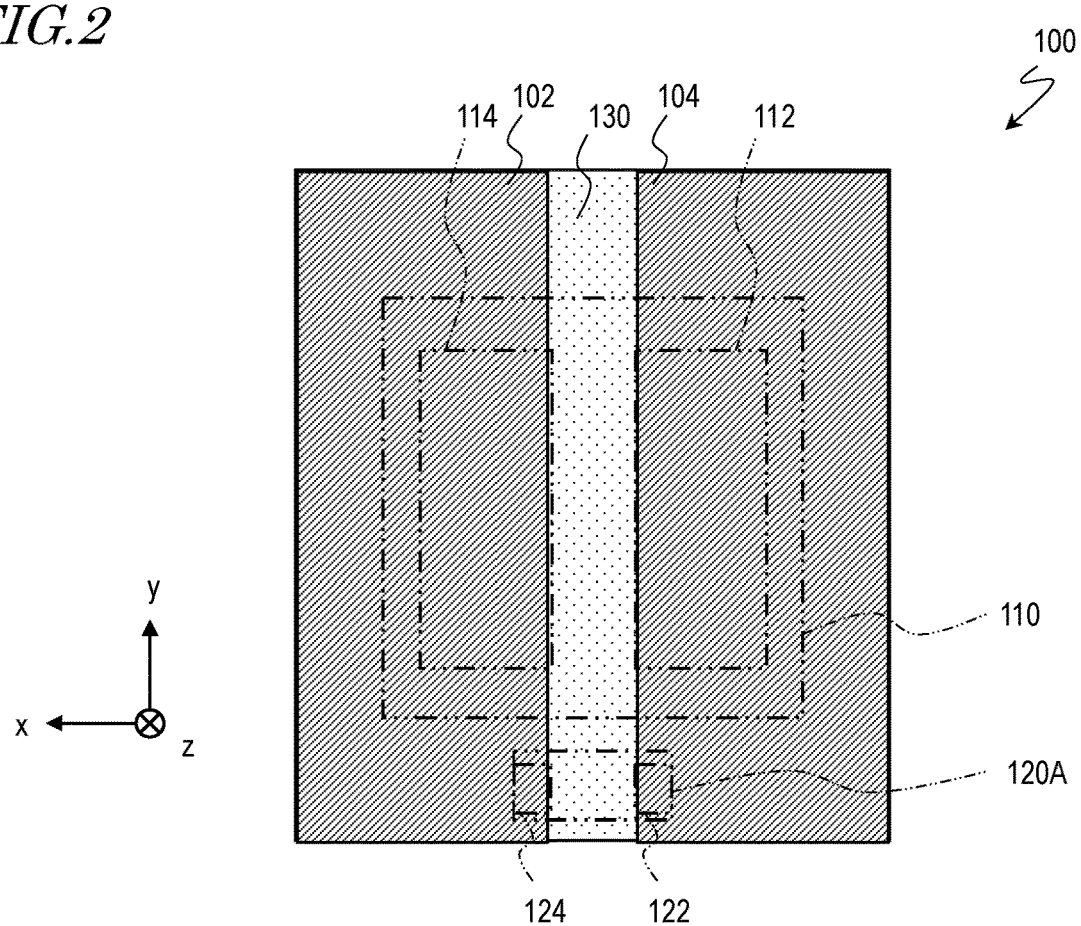
FIG. 2 is a schematic bottom view showing an exemplary configuration of a light-emitting device obtained by a method of manufacturing according to the first embodiment of the present disclosure.

FIG. 1 and FIG. 2 show an exemplary configuration of a light-emitting device obtained by a method of manufacturing according to an embodiment of the present disclosure. FIG. 1 and FIG. 2 are a schematic cross-sectional view and a schematic bottom view, respectively, of the light-emitting device. For the sake of reference, in each of FIG. 1 and FIG. 2, x, y and z axes which are perpendicular to one another are shown. The x, y and z axes are shown also in some of the other drawings of the present disclosure.

First, description will be given with reference to FIG. 1. A light-emitting device 100 shown in FIG. 1 includes a light-emitting element 110, a protective element 120A, and a light reflective resin layer 130. Note that, for ease of explanation, FIG. 1 shows a cross section of the light emitting device 100 in which a portion of the light reflective resin layer 130 is not shown.

The light-emitting element 110 has a lower surface (i.e., first surface) 110b on which an anode 112 and a cathode 114 are disposed, and an upper surface (i.e., second surface) 110u from which light is to be emitted. The z direction is parallel to a direction normal to the upper surface 110u of the light-emitting element 110. For the light-emitting element 110, a known semiconductor light-emitting element, such as semiconductor laser, LED, or the like can be used. In the description below, an LED is used for the light-emitting element 110, as an example.

The protective element 120A has an upper surface 120u and a lower surface (third surface) 120b. The protective element 120A includes a first terminal 122 and a second terminal 124, at least a part of which is located on a lower surface 120b side. Note that, in FIG. 1, the first terminal 122 and the second terminal 124 are electrodes on the lower surface 120b of the protective element 120A. However, FIG. 1 schematically shows the shape and arrangement of the first terminal 122 and the second terminal 124 for preventing the drawings to be excessively complicated. It is optional that the entirety of the first terminal 122 and the second terminal 124 is disposed on the lower surface 120b of the protective element 120A. In the present specification, the "terminal" of the protective element broadly includes a structure that can supply power from at least a surface side of the protective element to the protective element.

The protective element 120A serves to prevent application of an overcurrent due to electrostatic discharge (ESD), surge, etc., to the light-emitting element 110, which allows for preventing damage to the light-emitting element 110. Examples of the protective element 120A include Zener diodes, varistors, resistors, capacitors, and transient-voltage-suppression (TVS) diodes. In the description below, for the protective element 120A, a semiconductor die (bare chip) that includes a Zener diode is exemplified. The Zener diode is used in a state of being connected to the light-emitting element 110 in anti-parallel.

A Zener diode in which a semiconductor die is sealed by a resin (hereinafter, also referred to as a "Zener package diode") can be used in place of the bare chip. The Zener package diode generally includes lead electrodes extended from side portions thereof. These lead electrodes respectively have a shape bent toward the bottom of the package, for example, so as to be connectable with the wiring board, or the like, on the bottom side of the package. In the case where a Zener package diode is used for the protective element 120A, each of the lead electrodes of the Zener package diode correspond to respective one of the first terminal 122 and the second terminal 124.

As shown in FIG. 1, a surface of the anode 112 and a surface of the cathode 114 of the light-emitting element 110 are in alignment with a surface of the first terminal 122 and a surface of the second terminal 124 of the protective element 120A in the lower surface 130b of the light reflective resin layer. A surface of the anode 112 and a surface of the cathode 114 of the light-emitting element 110, and a surface of the first terminal 122 and a surface of the second terminal 124 of the protective element 120A are exposed from the lower surface 130b of the light reflective resin layer 130. The lower surface 130b is opposite to the upper surface 110u of the light-emitting element 110 in the light-emitting device 100.

The light-emitting device 100 includes, on a lower surface side thereof (i.e., on a side opposite to the upper surface 110u of the light-emitting element 110), a first electrode 102 electrically connecting the anode 112 of the light-emitting element 110 and the first terminal 122 of the protective element 120A together, and a second electrode 104 electrically connecting the cathode 114 of the light-emitting element 110 and the second terminal 124 of the protective element 120A together. As shown in FIG. 2, the first electrode 102 covers at least a portion of the anode 112 of the light-emitting element 110 and at least a portion of the first terminal 122 of the protective element 120A. Likewise, the second electrode 104 covers at least a portion of the cathode 114 of the light-emitting element 110 and at least a portion of the second terminal 124 of the protective element 120A.

As can be understood from FIG. 1 and FIG. 2, in this example, the light-emitting element 110 and the protective element 120A are electrically connected together in parallel (more specifically, in anti-parallel) by the first electrode 102 and the second electrode 104.

The light-emitting device 100 is secured to and electrically connected with the wiring board, or the like, via the first electrode 102 and the second electrode 104. According to the present embodiment, the light-emitting element 110 and the protective element 120A are electrically connected together by the first electrode 102 and the second electrode 104, and therefore, it is not necessary to separately connect the anode 112 and the cathode 114 of the light-emitting element 110, and the first terminal 122 and the second terminal 124 of the protective element 120A to a wiring board or the like. Further, the area of each of the first electrode 102 and the second electrode 104 can be increased as compared with the area of each of the anode 112, the cathode 114, the first terminal 122, and the second terminal 124, so that the first electrode 102 and the second electrode 104 can be easily aligned with respect to the wiring board or the like, and thus more secure electrical connection with the wiring board or the like can be achieved. That is, mounting to the wiring board or the like (e.g., mounting by flip chip connection) is can be performed more easily.

As shown in FIG. 2, in this example, the protective element 120A is located on a lateral side of the light-emitting element 110 in the xy plane (i.e., in a plane parallel to the upper surface 110u of the light-emitting element 110). The arrangement of protective element 120A is not limited to this example. For example, the protective element 120A may be arranged such that a portion of the protective element 120A overlaps the light-emitting element 110. Alternatively, the protective element 120A may be arranged such that the entirety of the protective element 120A does not overlap the light-emitting element 110. Arrangement of the protective element 120A in which at least a portion of the protective element 120A overlaps the light-emitting element 110 is advantageous in reducing the size of the light-emitting device 100. For example, as will be described below, the protective element 120A may be arranged such that the entirety of the protective element 120A overlaps the light-emitting element 110.

Again, description will be given with reference to FIG. 1. As shown in FIG. 1, a lateral portion 110s of the light-emitting element 110 and a lateral portion 120s of the protective element 120A are covered with the light reflective resin layer 130. The light reflective resin layer 130 is a layer having a reflectance with respect to light emitted from the light-emitting element 110 of, for example, 60% or greater. The light reflective resin layer 130 is, for example a resin layer in which a light reflective filler is dispersed. The light reflective resin layer 130 serves to prevent light emitted from the light-emitting element 110 from leaking laterally and downward from the light-emitting device 100. The reflectance of light emitted from the light-emitting element 110 may be greater than 70%, or greater than 80% or 90%, and can be selected appropriately.

As shown in FIG. 1, a protecting layer 160 may be disposed above the upper surface 110u of the light-emitting element 110. The protecting layer 160 is, for example, a light-transmitting resin layer. The light emitted from the light-emitting element 110 is emitted toward an outside of the light-emitting device 100 via the protecting layer 160. As schematically shown in FIG. 1, a lateral portion 160s of the protecting layer 160 is also covered with the light reflective resin layer 130.

In this example, the light-emitting device 100 includes a wavelength conversion layer 150 and a light guide 140 which are interposed between the light-emitting element 110 and the protecting layer 160. The wavelength conversion layer 150 is a layer, for example, in which a fluorescent material such as phosphor is dispersed in a resin. In the configuration illustrated in FIG. 1, the wavelength conversion layer 150 is disposed adjacent to the protecting layer 160 at a light-emitting element 110 side, and a portion of the light guide 140 is located between the upper surface 110u of the light-emitting element 110 and the lower surface 150b of the wavelength conversion layer 150.

In the configuration illustrated in FIG. 1, the light guide 140 includes a first light guide portion 140a and a second light guide portion 140b. The first light guide portion 140a is a portion of the light guide 140 between the lower surface 150b of the wavelength conversion layer 150 and the upper surface 110u of the light-emitting element 110. The second light guide portion 140b is a portion of the light guide 140 on at least a portion of each of lateral surfaces of the light-emitting element 110 connecting the upper surface 110u and the lower surface 110b of the light-emitting element 110. As schematically shown in FIG. 1, for example, the second light guide portion 140b has a shape that widens from the light-emitting element 110 toward the protecting layer 160. With the second light guide portion 140b on at least a portion of each of the lateral surfaces connecting the upper surface 110u and the lower surface 110b of the light-emitting element 110, light emitted from the lateral surfaces of the light-emitting element 110 can be guided to the protecting layer 160 side. That is, with the second light guide portion 140b, light extraction efficiency can be improved. In a cross-sectional view, the border between the second light guide portion 140b and the light reflective resin layer 130 may not be linear, and for example, may be curved. The term "curved" includes both being curved to be convex outward (toward the light reflective resin layer 130) and being curved to be convex inward (toward the light-emitting element 110). In view of light extraction efficiency, it is advantageous that the border between the second light guide portion 140b and the light reflective resin layer 130 is curved to be convex outward in a cross-sectional view. Each of the lateral surfaces connecting the upper surface 110u and the lower surface 110b of the light-emitting element 110 is not limited to be a flat surface, and alternatively may be a surface having one or more steps or a curved surface.

Figure 3:
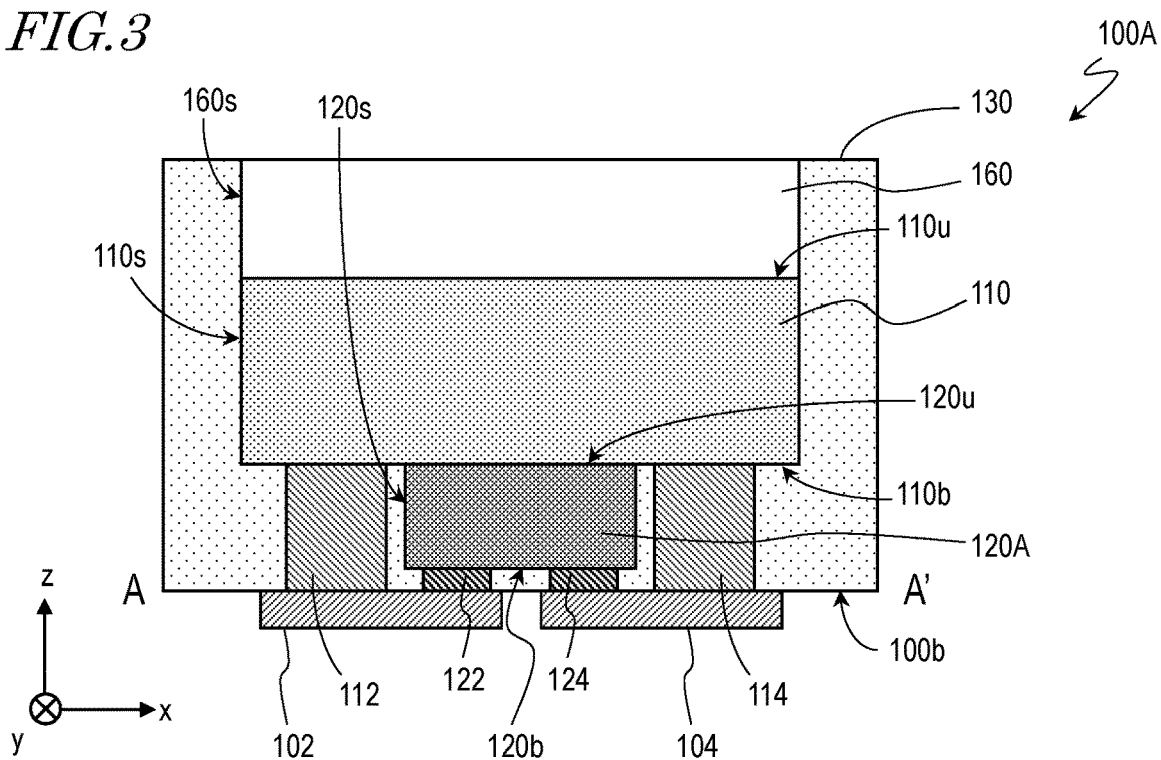
FIG. 3 is a schematic cross-sectional view showing another example of a light-emitting device obtained by a method of manufacturing according to the first embodiment of the present disclosure.
Figure 4:
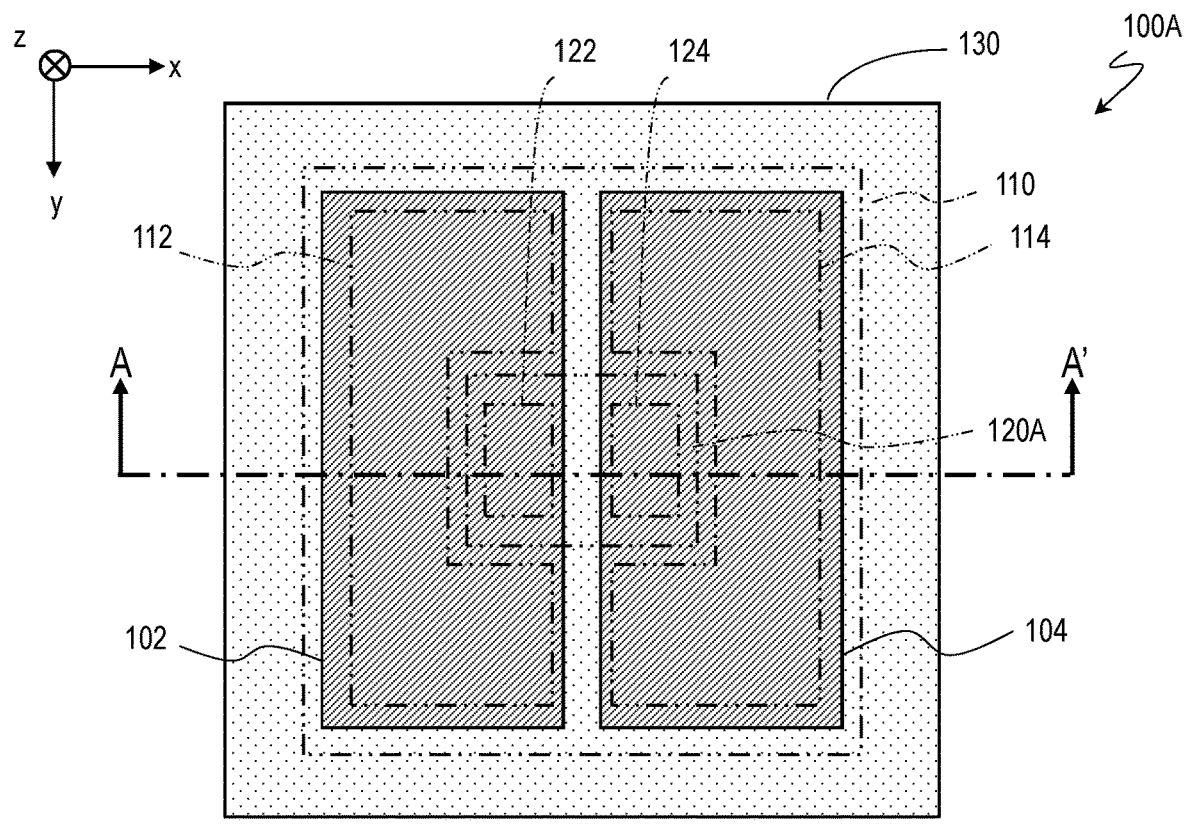
FIG. 4 is a schematic plan view showing another example of a light-emitting device obtained by a method of manufacturing according to the first embodiment of the present disclosure.

The wavelength conversion layer 150 and the light guide 140 are optionally disposed in the light-emitting device of the present disclosure, and may not be disposed. FIG. 3 and FIG. 4 show another example of the light-emitting device obtained by a method of manufacturing according to a first embodiment of the present disclosure. FIG. 3 and FIG. 4 are a schematic cross-sectional view and a schematic bottom view, respectively, of the light-emitting device. FIG. 3 is a cross-sectional view taken along a line A-A' of FIG. 4.

In a light-emitting device 100A shown in FIG. 3, a protecting layer 160 is disposed on an upper surface 110u of a light-emitting element 110. In this example, the protecting layer 160 is illustrated such that lateral portion 160s of the protecting layer 160 are in alignment with lateral portion 110s of the light-emitting element 110, but the lateral portion 160s of the protecting layer 160 may not be in alignment with lateral portion 110s of the light-emitting element 110. When viewed in a direction perpendicular to the upper surface 110u of the light-emitting element 110 (in the present embodiment, in a direction parallel to the z direction), the protecting layer 160 may have an area larger than the light-emitting element 110.

As shown in FIG. 4, in this example, the protective element 120A is disposed such that the entirety of the protective element 120A overlaps the light-emitting element 110 in a plan view. In a plan view, the protective element 120A is substantially at the center of the light-emitting element 110, and accordingly, each of an anode 112 and a cathode 114 of the light-emitting element 110 has a C-shape. Arrangement of the protective element 120A such that at least a portion of the protective element 120A overlaps the light-emitting element 110 is advantageous, and arrangement of the protective element 120A such that the entirety of the protective element 120A overlaps the light-emitting element 110 is particularly advantageous, in reducing the size of the light-emitting device 100A.

Method of Manufacturing Light-Emitting Device

Certain examples of a method of manufacturing a light-emitting device according to an embodiment of the present disclosure is described below with reference to drawings. An exemplary method of manufacturing the light-emitting device 100 that has been described with reference to FIG. 1 and FIG. 2 will be described below.

First Example

Figure 5:
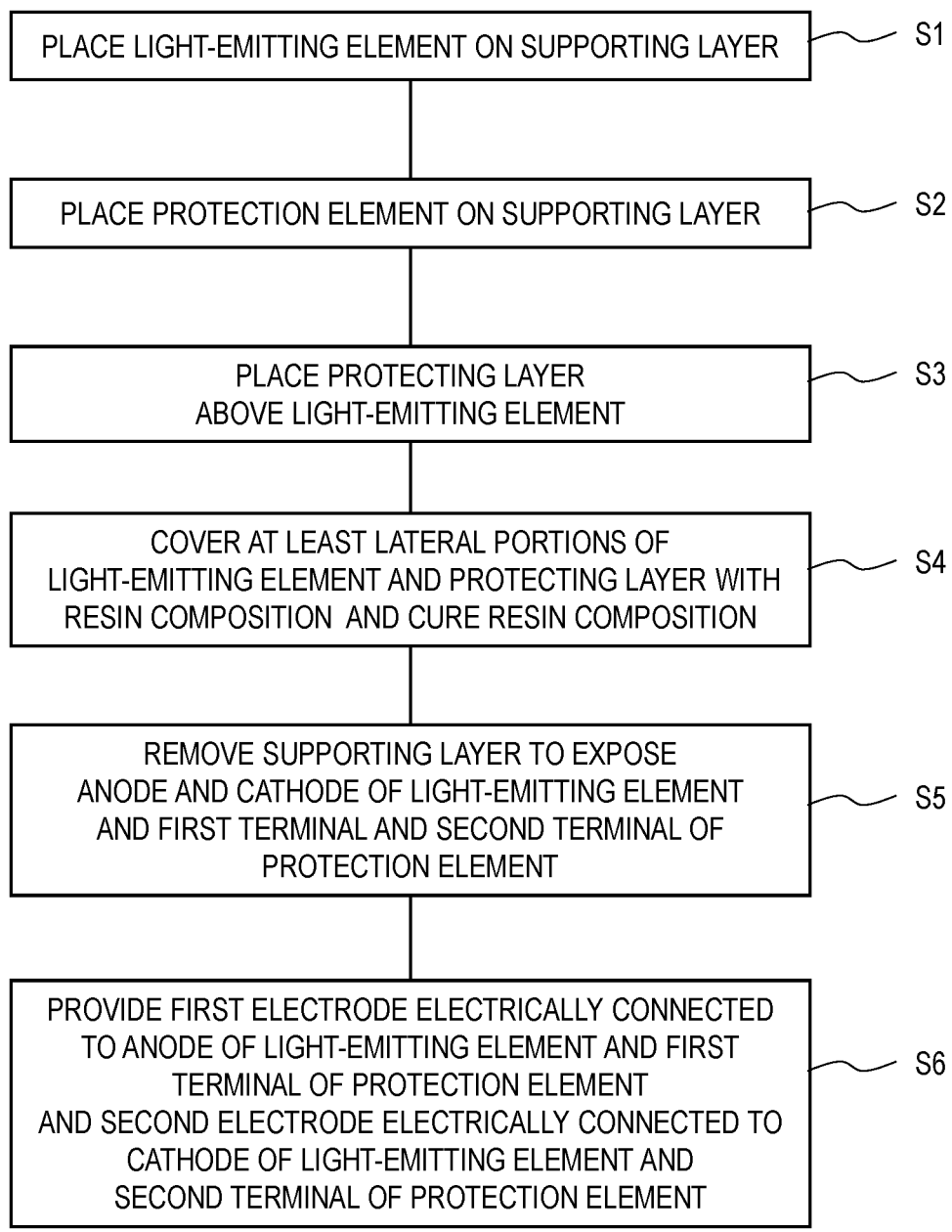
FIG. 5 is a flowchart illustrating the outline of a method of manufacturing a light-emitting device according to the first embodiment of the present disclosure.

FIG. 5 is a flowchart illustrating the outline of a method of manufacturing a light-emitting device according to a first embodiment of the present disclosure. FIG. 6 to FIG. 19 are diagrams for illustrating steps in the method of manufacturing the light-emitting device according to the first embodiment of the present disclosure. In each of FIG. 6 to FIG. 19, a schematic plan view and a schematic side view (or a cross-sectional view) are shown.

First, a light-emitting element 110 is provided that includes an anode 112 and a cathode 114 at a surface opposite to a light-emitting surface. Each of the anode 112 and the cathode 114 is an electrode for supplying power to the light-emitting element 110, and is, for example, a monolayer or multilayer film of metals such as Ag, Al, Au, Cu, Ti, Ni, Pt, Pd, W, or an alloy of two or more of these. The anode 112 and the cathode 114 can be formed by, for example, using an electroplating technique. Each of the anode 112 and the cathode 114 has a height (i.e., a length along the z direction) of, for example, approximately 5 µm or greater and 200 µm or less.

Figure 6:
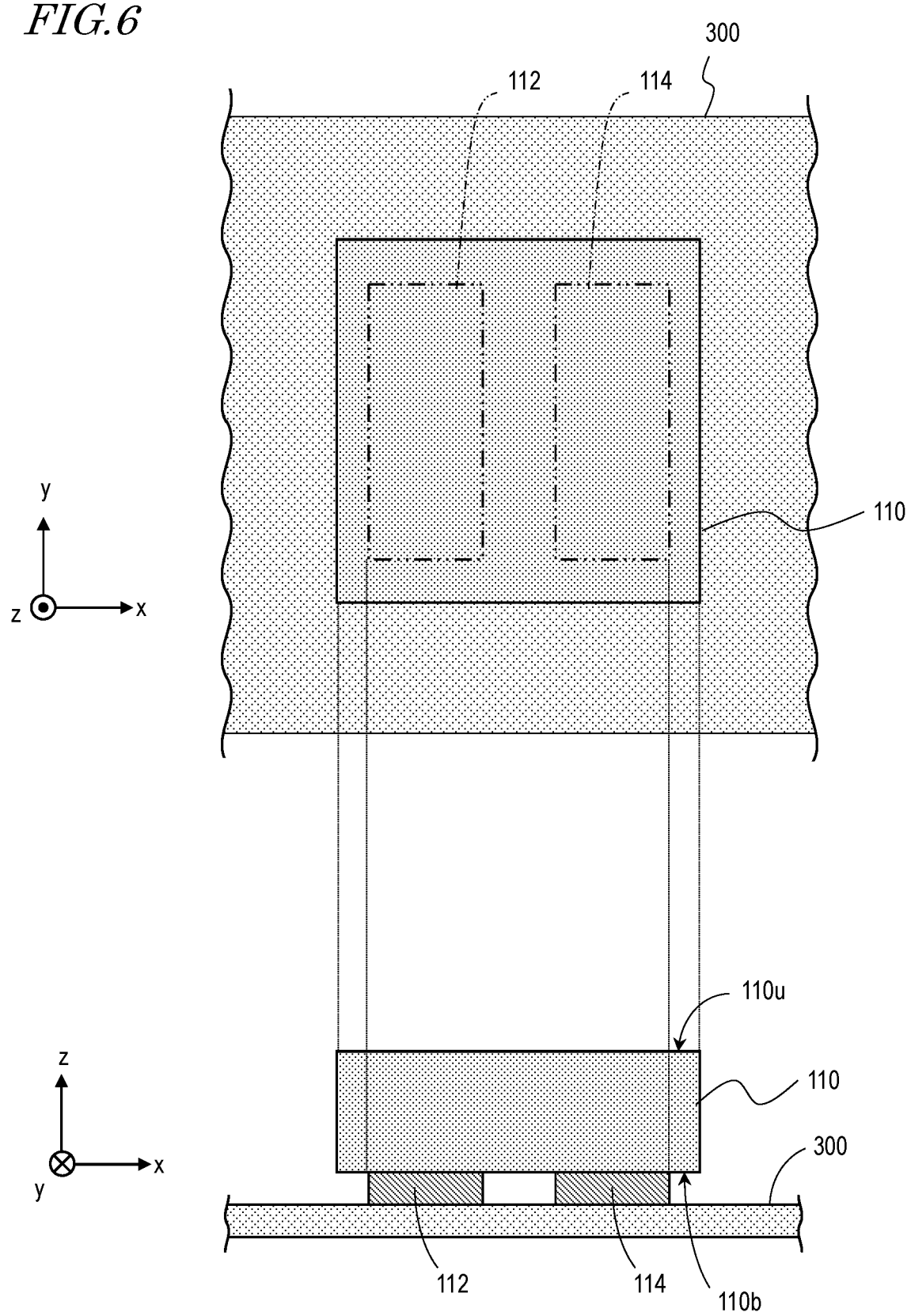
FIG. 6 is a diagram for illustrating a step in a method of manufacturing a light-emitting device according to the first embodiment of the present disclosure.

Then, as shown in FIG. 6, the light-emitting element 110 is temporarily secured onto a supporting layer 300. The light-emitting element 110 is placed on the supporting layer 300 such that, of the upper surface 110u and the lower surface 110b of the light-emitting element 110, the lower surface 110b on which the anode 112 and the cathode 114 are disposed faces the supporting layer 300 (Step S1 of FIG. 5). Examples of the supporting layer 300 include a resin tape including an adhesive layer of a UV-curable material (e.g., backgrinding tape, dicing tape, etc.). Also, a resin substrate, a glass substrate, a ceramic substrate, a metal substrate, or the like may be used for the supporting layer 300. Any appropriate technique that allows the light-emitting element 110 to be separated from the supporting layer 300 may be employed for securing the light-emitting element 110 onto the supporting layer 300. For example, in the case where a glass substrate is used for the supporting layer 300, the light-emitting element 110 can be temporarily secured onto the supporting layer 300 using a photocurable resin, a wax, or the like. In the case of employing any technique for securing the light emitting element 110, the light-emitting element 110 is secured onto the supporting layer 300 such that a surface of the anode 112 and a surface of the cathode 114 are in contact with a surface of the supporting layer 300.

Figure 7:
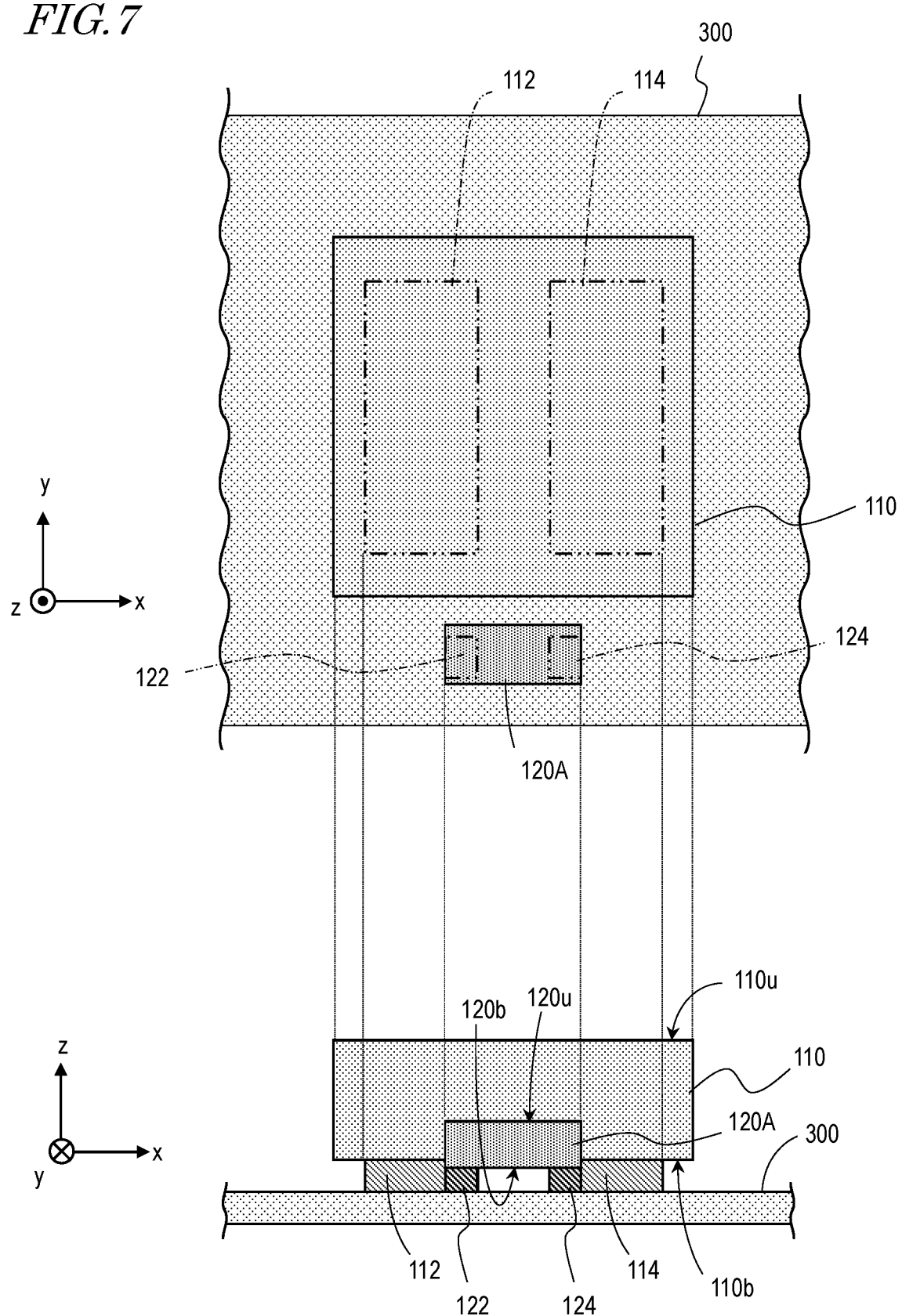
FIG. 7 is a diagram for illustrating a step in a method of manufacturing a light-emitting device according to the first embodiment of the present disclosure.

Then, a protective element 120A is provided that includes the first terminal 122 (e.g., at an anode 112 side) and the second terminal 124 (e.g., at a cathode 114 side) on at least one surface of the protective element 120A. Then, as shown in FIG. 7, the protective element 120A is temporarily secured onto the supporting layer 300. At this time, the protective element 120A is placed on the supporting layer 300 such that a surface of the protective element 120A on which the first terminal 122 and the second terminal 124 are disposed (in the present embodiment, the lower surface 120b) faces the supporting layer 300 (Step S2 of FIG. 5). As in the light-emitting element 110, any appropriate technique may be employed for securing the protective element 120A. The protective element 120A is secured onto the supporting layer 300 such that at least a portion of a surface of the first terminal 122 and at least a portion of a surface of the second terminal 124 are in contact with a surface of the supporting layer 300.

In this example, the light-emitting element 110 and the protective element 120A are arranged on the supporting layer 300 such that the light-emitting element 110 and the protective element 120A do not overlap with each other. The arrangement of the light-emitting element 110 and the protective element 120A is not limited to that illustrated in FIG. 7. As described above, for example, the protective element 120A may be covered with the light-emitting element 110. Also, the light-emitting element 110 and the protective element 120A are arranged on the supporting layer 300 (or the order of Step S1 and Step S2 illustrated in FIG. 5) in any appropriate order. The protective element 120A may be placed on the supporting layer 300 before the light-emitting element 110 is placed on the supporting layer 300. Alternatively, the light-emitting element 110 and the protective element 120A may be simultaneously placed on the supporting layer 300.

Further, a single light-emitting element 110 or a plurality of light-emitting elements 110 may be disposed on the supporting layer 300, and a single protection element 120A or a plurality of protection elements 120A may be disposed on the supporting layer 300. On the supporting layer 300, a plurality of sets of at least one light-emitting element 110 and at least one protective element 120A may be arranged. The sets of the light-emitting element 110 and the protective element 120A can be arranged in rows and columns over the supporting layer 300. With the plurality of sets of the light-emitting element 110 and the protective element 120A arranged on the supporting layer 300, a plurality of light-emitting devices can be efficiently manufactured at once.

Figure 8:
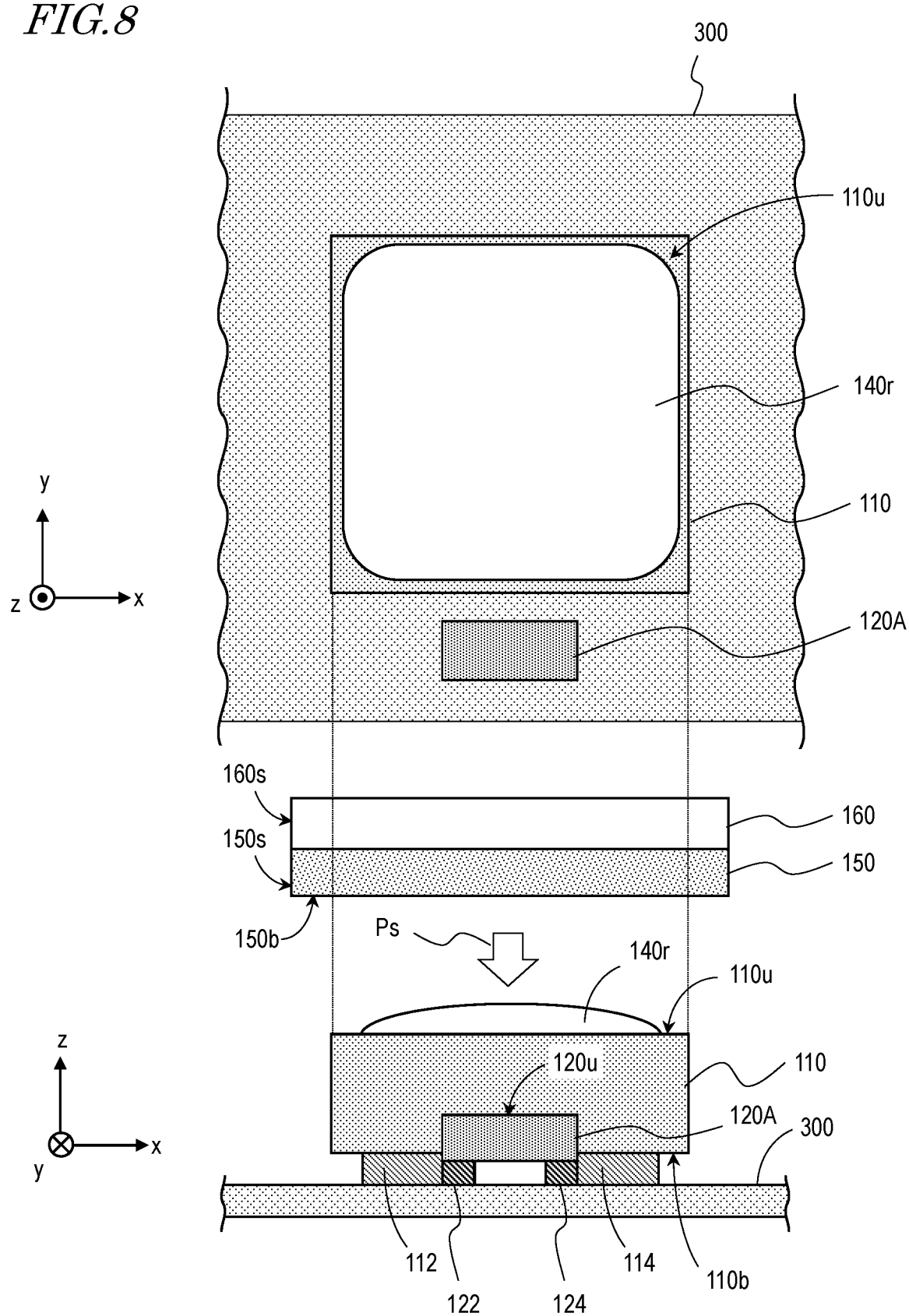
FIG. 8 is a diagram for illustrating a step in a method of manufacturing a light-emitting device according to the first embodiment of the present disclosure.

Then, a protecting layer 160 is placed above the light-emitting element 110 (Step S3 of FIG. 5). At this time, as shown in FIG. 8, an uncured light-transmitting adhesive agent 140r is applied onto the upper surface 110u of the light-emitting element 110 using a dispenser or the like. Thereafter, a multilayer structure including the protecting layer 160 and the wavelength conversion layer 150 is placed on the light-transmitting adhesive agent 140r, and the light-transmitting adhesive agent 140r is cured, so that the protecting layer 160 and the wavelength conversion layer 150 are secured to the light-emitting element 110.

The protecting layer 160 can be a resin layer that contains a silicone resin, a modified silicone resin, an epoxy resin, a phenolic resin, a polycarbonate resin, an acrylic resin, a trimethylpentene resin or a polynorbornene resin, or two or more of these resins. The protecting layer 160 may be a layer made of glass.

The wavelength conversion layer 150 is, for example, a layer in which phosphor particles are dispersed and which is adapted to absorb a portion of light emitted from the light-emitting element 110 and adapted to convert the absorbed light to light in a wavelength region is different from that of the light emitted from the light-emitting element 110. The wavelength conversion layer 150 can be formed using a resin composition in which particles of a phosphor, which is a wavelength-converting substance, are dispersed in a resin material. Examples of the resin material in which the phosphor particles are to be dispersed include silicone resins, modified silicone resins, epoxy resins, modified epoxy resins, urea resins, phenolic resins, acrylic resins, urethane resins, fluorocarbon resins, and a resin containing two or more of these resins. A known material can be used for the phosphor. Examples of the phosphor include yttrium aluminum garnet (YAG)-based phosphors, fluoride-based phosphors such as KSF-based phosphors, and β-SiAlON phosphor. The YAG-based phosphors are included in examples of a wavelength conversion material adapted to convert blue light to yellow light, the KSF-based phosphors are included in examples of a wavelength conversion material adapted to convert blue light to red light, and the β-SiAlON phosphor is included in examples of a wavelength conversion material adapted to convert blue light to green light. The phosphor may be a quantum dot phosphor.

For example, a slurry containing a phosphor, a resin material such as a silicone resin, inorganic filler particles, and a solvent is applied onto one of principal surfaces of the protecting layer 160 by using a method such as spraying, casting, or potting, and the applied material is cured, so that a multilayer structure of the protecting layer 160 and the wavelength conversion layer 150 can be formed. Alternatively, the multilayer structure including the protecting layer 160 and the wavelength conversion layer 150 can be formed by providing a phosphor sheet made of a resin material in which phosphor particles are dispersed in a resin in the B stage and a light-transmissive sheet (e.g., a sheet of a transparent resin), and bonding the phosphor sheet and the light-transmissive sheet together. In the schematic structure shown in FIG. 8, the lateral portion 160s of the protecting layer 160 is in alignment with the lateral portion 150s of the wavelength conversion layer 150, but this arrangement is optional.

In placing the wavelength conversion layer 150 and the protecting layer 160 on the light-transmitting adhesive agent 140r, the protecting layer 160 is pressed toward the upper surface 110u of the light-emitting element 110 as schematically indicated by a thick arrow Ps in the lower part of FIG. 8, so that the light-transmitting adhesive agent 140r can be spread toward a periphery of the upper surface 110u. Thereafter, the light-transmitting adhesive agent 140r is cured, so that the light guide 140 can be formed on a lower surface 150b side of the wavelength conversion layer 150 as shown in the lower part of FIG. 9. In the configuration illustrated in FIG. 9, the first light guide portion 140a of the light guide 140 is disposed between the lower surface 150b of the wavelength conversion layer 150 and the upper surface 110u of the light-emitting element 110.

Figure 9:
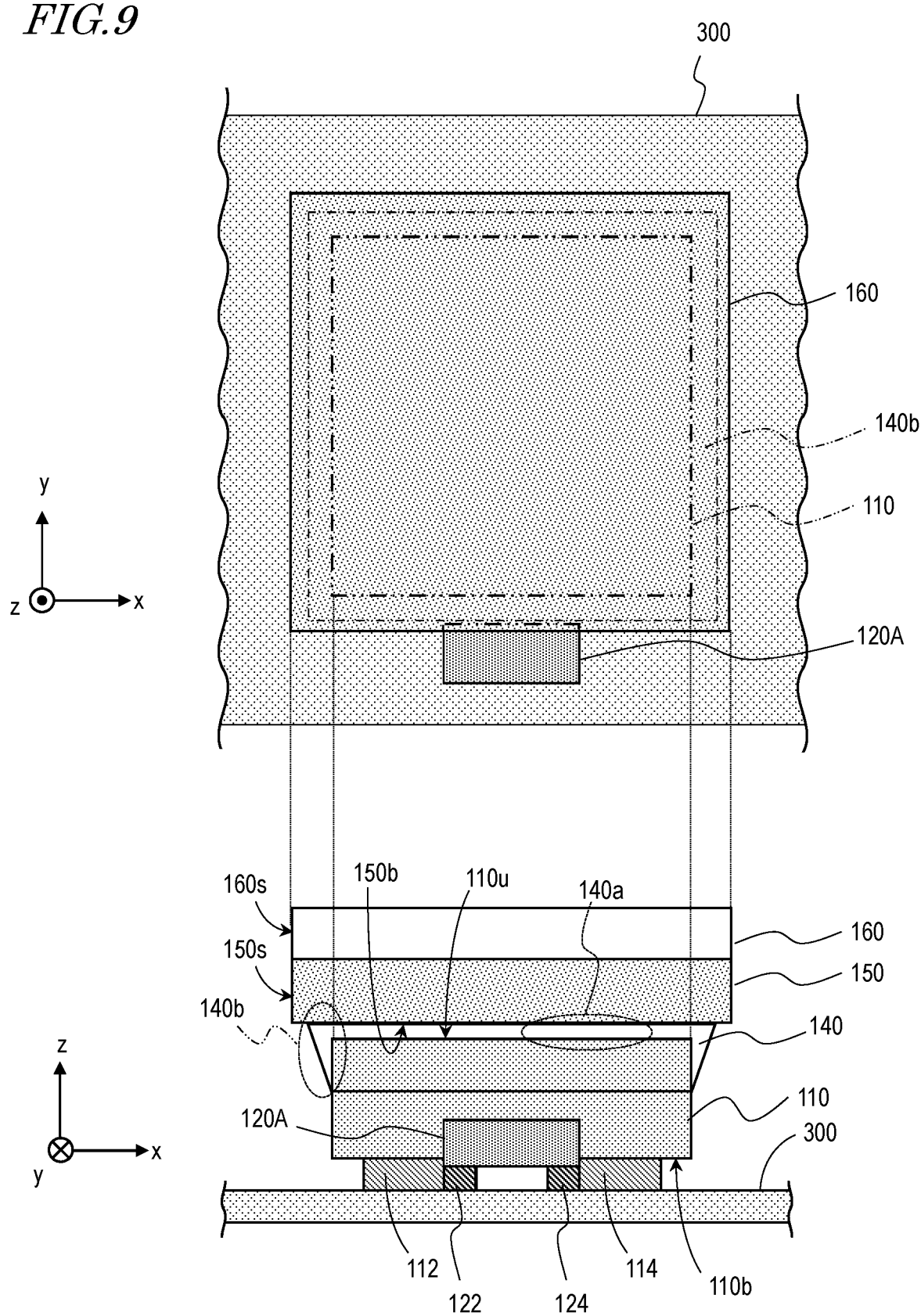
FIG. 9 is a diagram for illustrating a step in a method of manufacturing a light-emitting device according to the first embodiment of the present disclosure.

As illustrated in the upper part (plan view) of FIG. 9, for example, the second light guide portion 140b surrounds the light-emitting element 110 when viewed in a direction perpendicular to the upper surface 110u of the light-emitting element 110. The second light guide portion 140b may be selectively formed without forming the first light guide portion 140a. With the second light guide portion 140b for which the light-transmitting adhesive agent 140r having a higher refractive index than that of the resin used for the light reflective resin layer 130 is used, light emitted from the lateral surfaces of the light-emitting element 110 can be efficiently reflected toward the wavelength conversion layer 150 utilizing total reflection at the interface between the second light guide portion 140b and the light reflective resin layer 130. In other words, an effect of improving light utilization efficiency of the light-emitting device is obtained.

In this example, when viewed in a direction perpendicular to the upper surface 110u of the light-emitting element 110 (in the present example, in a direction parallel to the z direction), the protecting layer 160 has an area greater than that of the light-emitting element 110, and a portion of the protecting layer 160 extends over the protective element 120A. The protective element 120A over the supporting layer 300 may be arranged at any appropriate position so long as the protective element 120A does not physically interfere with the light-emitting element 110, the light guide 140, the wavelength conversion layer 150 and the protecting layer 160.

An example in which the multilayer structure including the wavelength conversion layer 150 and the protecting layer 160 is placed on the light-transmitting adhesive agent 140r is described above, but the method of placing the wavelength conversion layer 150 and the protecting layer 160 is not limited thereto. For example, after the wavelength conversion layer 150 is placed on the light-transmitting adhesive agent 140r, the protecting layer 160 may be secured onto the wavelength conversion layer 150 using a light-transmitting adhesive agent or the like. Alternatively, the protecting layer 160 may be formed on the wavelength conversion layer 150 after the wavelength conversion layer 150 is placed on the light-transmitting adhesive agent 140r.

Figure 10:
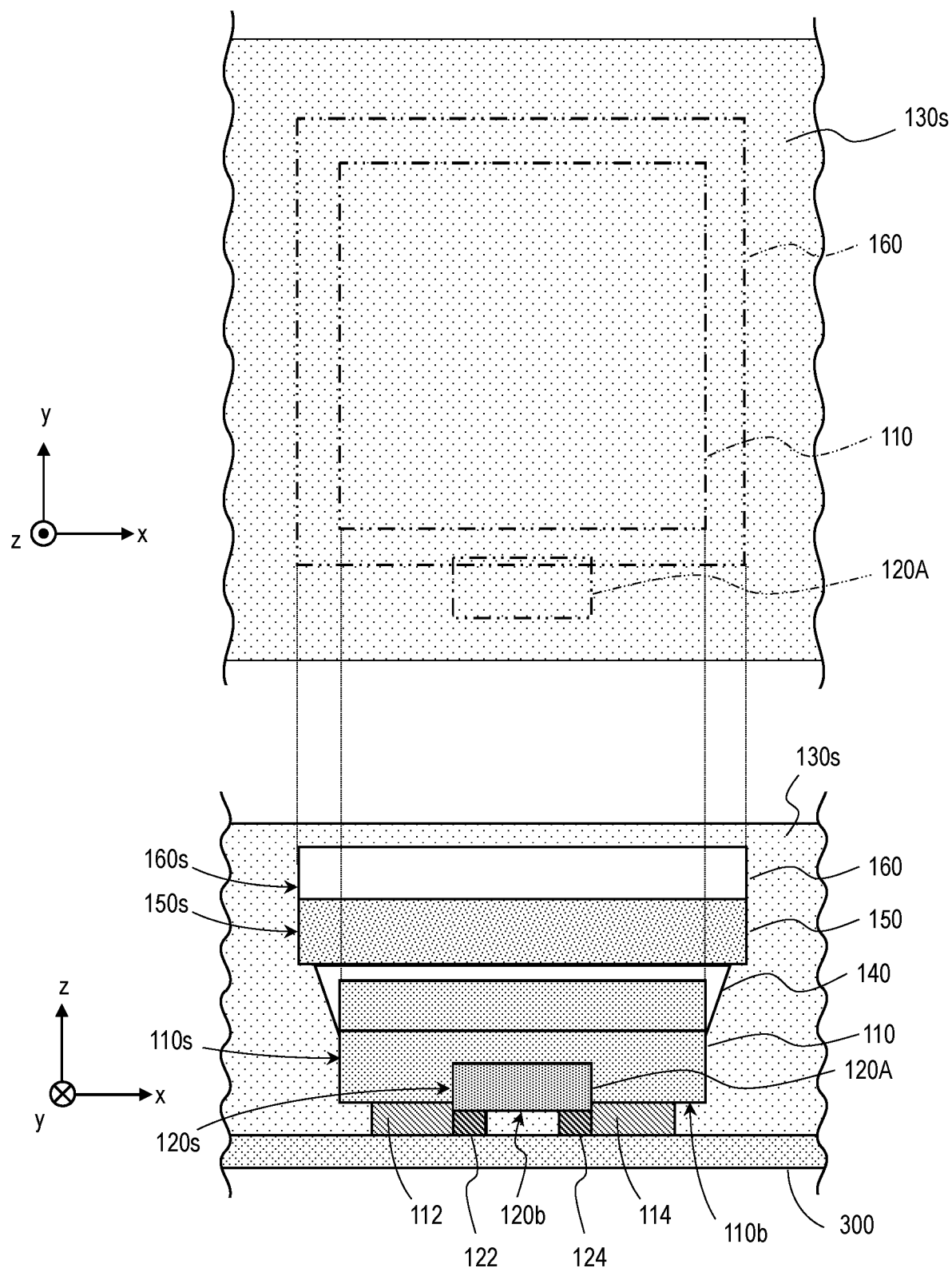
FIG. 10 is a diagram for illustrating a step in a method of manufacturing a light-emitting device according to the first embodiment of the present disclosure.

Then, an uncured resin composition is applied onto the supporting layer 300, and the resin composition is cured. At this time, the resin composition is applied onto the supporting layer 300 such that at least the lateral portion 110s of the light-emitting element 110 and the lateral portion 160s of the protecting layer 160 are covered with the resin composition (Step S4 of FIG. 5). For example, a resin composition in which a light reflective filler is dispersed is applied onto the supporting layer 300. Thereafter, the resin composition is cured, so that a resin layer 130s that covers the light-emitting element 110 and the protective element 120A can be formed as shown in FIG. 10.

Examples of the resin material in which the light reflective filler is to be dispersed include silicone resins, modified silicone resins, epoxy resins, modified epoxy resins, urea resins, phenolic resins, acrylic resins, urethane resins, fluorocarbon resins, or a resin containing two or more of these resins. For the light reflective filler, metal particles, or particles of an inorganic or organic material that has a refractive index higher than the resin material in which the light reflective filler is to be dispersed, can be used. Examples of the light reflective filler include particles of titanium dioxide, silicon dioxide, zirconium dioxide, potassium titanate, alumina, aluminum nitride, boron nitride, mullite, niobium oxide, barium sulfate, silicon oxide, rare earth oxides (e.g., yttrium oxide, gadolinium oxide), etc.

For example, compression molding can be employed for the formation of the resin layer 130s. In the case where compression molding is employed, for example, an epoxy-based or silicone-based mold compound in a powder state can be used for the resin composition for the resin layer 130s. As schematically shown in the lower part of FIG. 10, a portion of the resin layer 130s may be also located between the supporting layer 300 and the lower surface 110b of the light-emitting element 110, and between the supporting layer 300 and the lower surface 120b of the protective element 120A. Note that, for the sake of convenience in description, FIG. 10 shows a cross-sectional view in which illustration of a portion of the resin layer 130s is omitted. The same applies to the subsequent drawings.

Figure 11:
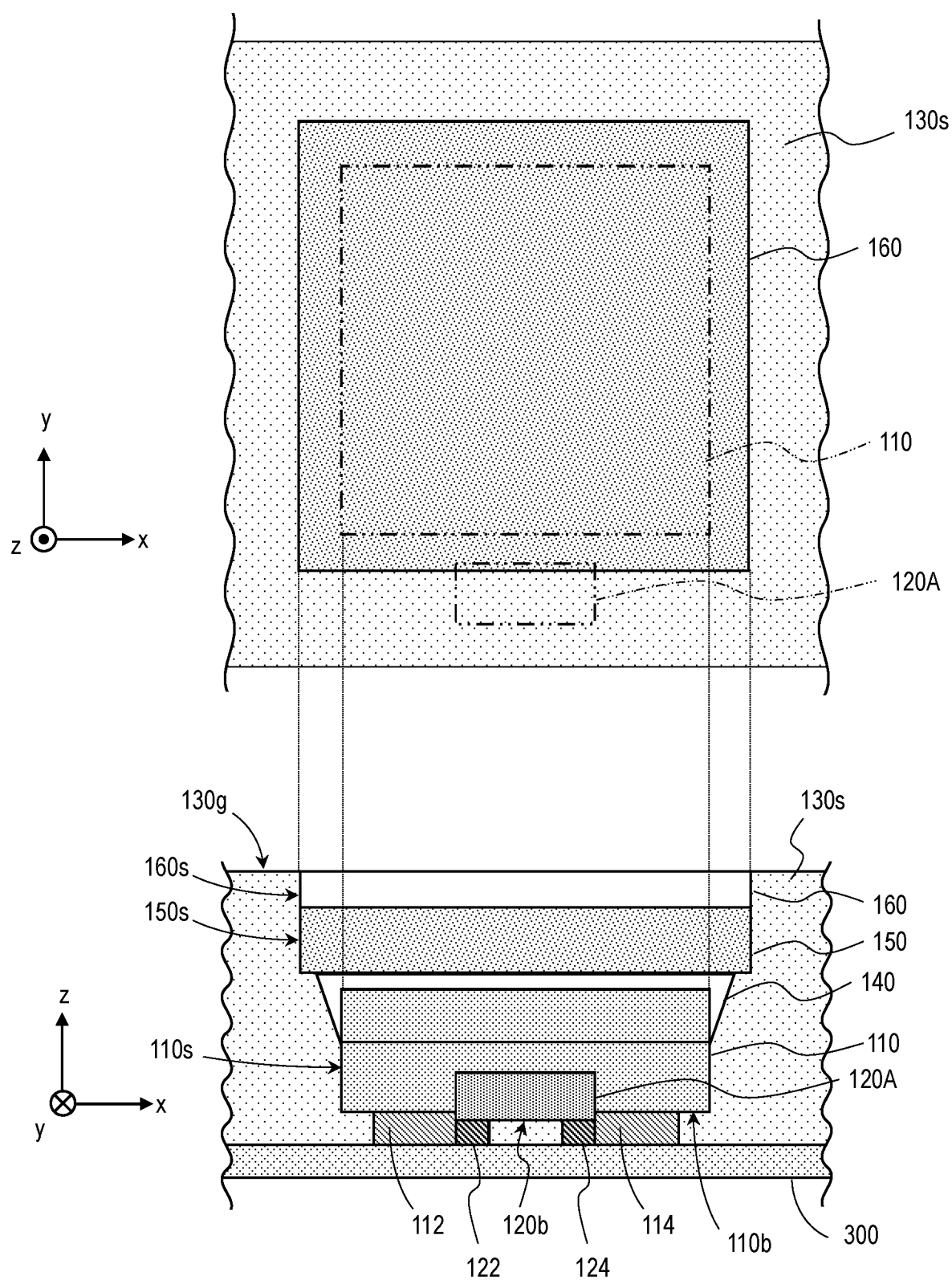
FIG. 11 is a diagram for illustrating a step in a method of manufacturing a light-emitting device according to the first embodiment of the present disclosure.
Figure 12:
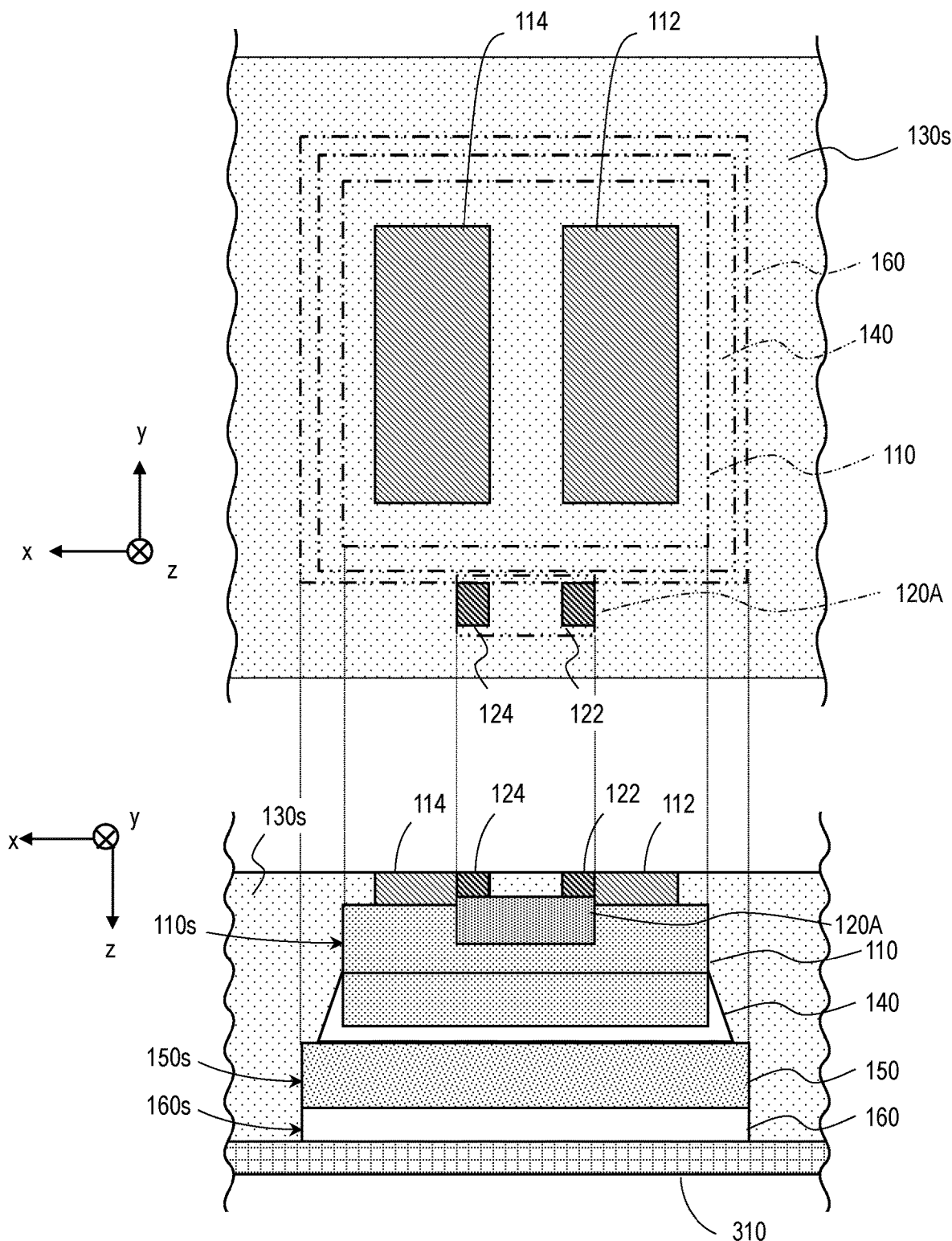
FIG. 12 is a diagram for illustrating a step in a method of manufacturing a light-emitting device according to the first embodiment of the present disclosure.

Then, a portion of the resin layer 130s is removed such that the protecting layer 160 is exposed from the resin layer 130s as shown in FIG. 11. For example, the resin layer 130s is ground from a side opposite to the supporting layer 300 toward the supporting layer 300. By the grinding, a ground surface 130g is formed on the side opposite to the supporting layer 300, and the protecting layer 160 is exposed from the resin layer 130s. At this time, a portion of the protecting layer 160 may be removed together with the resin layer 130s.

Then, for example, the light-emitting element 110 and the protective element 120A, together with the resin layer 130s, are temporarily secured to a second supporting layer 310. More specifically, as shown in the lower part of FIG. 12, the light-emitting element 110 and the protective element 120A are temporarily secured to the supporting layer 310 such that the protecting layer 160 that is exposed from the resin layer 130s faces the supporting layer 310. For the supporting layer 310, a backgrinding tape, a dicing tape, or the like can be used, as used for the above-described supporting layer 300. Thereafter, the supporting layer 300 is removed, so that the anode 112 and the cathode 114 of the light-emitting element 110 and the first terminal 122 and the second terminal 124 of the protective element 120A are exposed from the resin layer 130s (Step S5 of FIG. 5). In the case where a resin tape including an adhesive layer of a UV-curable material is used for the supporting layer 300, irradiating the supporting layer 300 with ultraviolet light allows the supporting layer 300 to be easily removed from the resin layer 130s.

Figure 13:
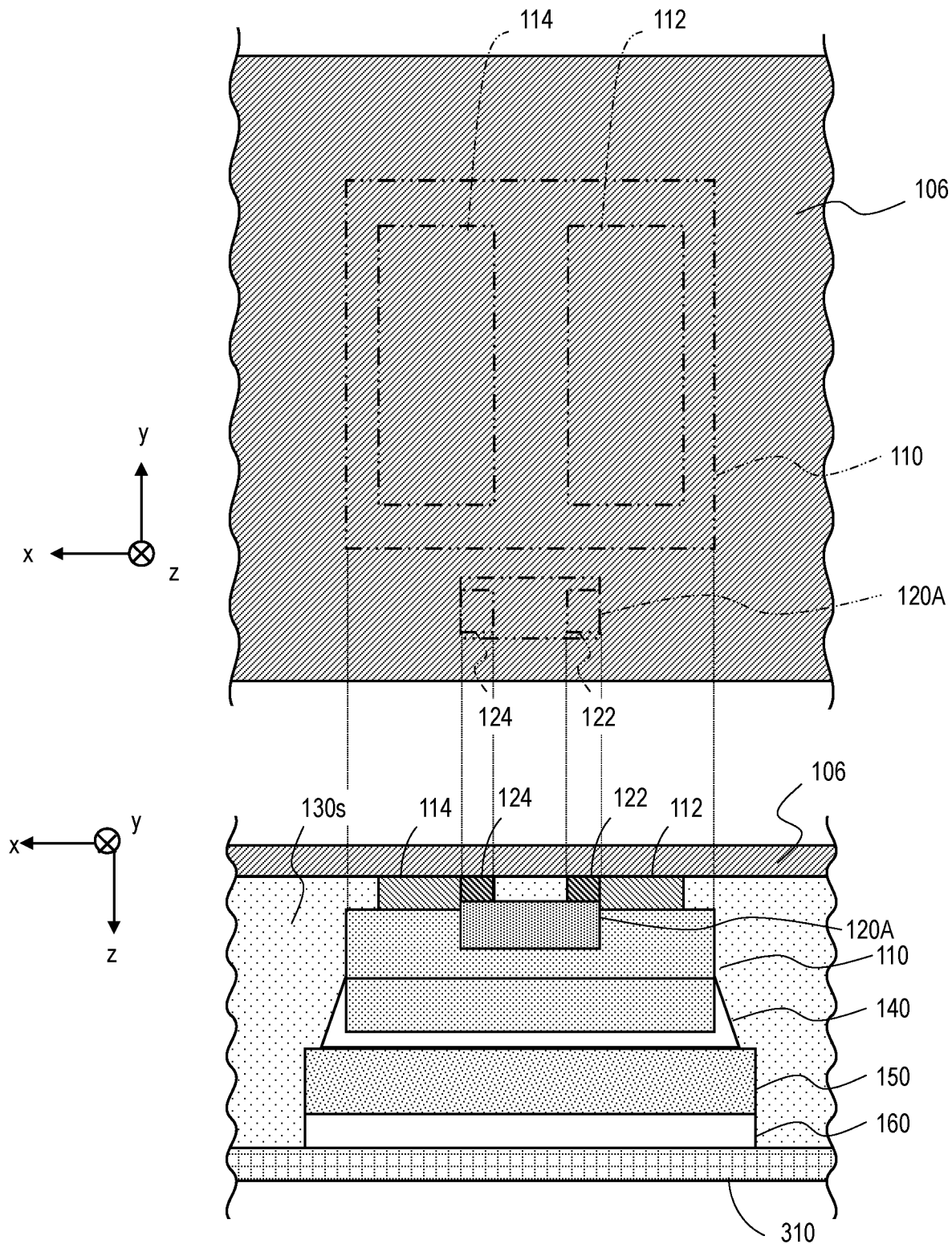
FIG. 13 is a diagram for illustrating a step in a method of manufacturing a light-emitting device according to the first embodiment of the present disclosure.

Then, a plurality of electrodes are formed on a surface at which the anode 112 and the cathode 114 of the light-emitting element 110 and the first terminal 122 and the second terminal 124 of the protective element 120A are exposed. For example, as shown in FIG. 13, first, an electrically-conductive layer 106 of Cu, Au, or the like, is formed on a surface at which the anode 112 and the cathode 114 of the light-emitting element 110 and the first terminal 122 and the second terminal 124 of the protective element 120A are exposed. Sputtering, vapor deposition, electroless plating, or the like, can be employed for forming the electrically-conductive layer 106. The electrically-conductive layer 106 may be formed by disposing a Ni film having good adhesion to a resin material and thereafter depositing, for example, an Au or Au alloy film thereon.

Figure 14:
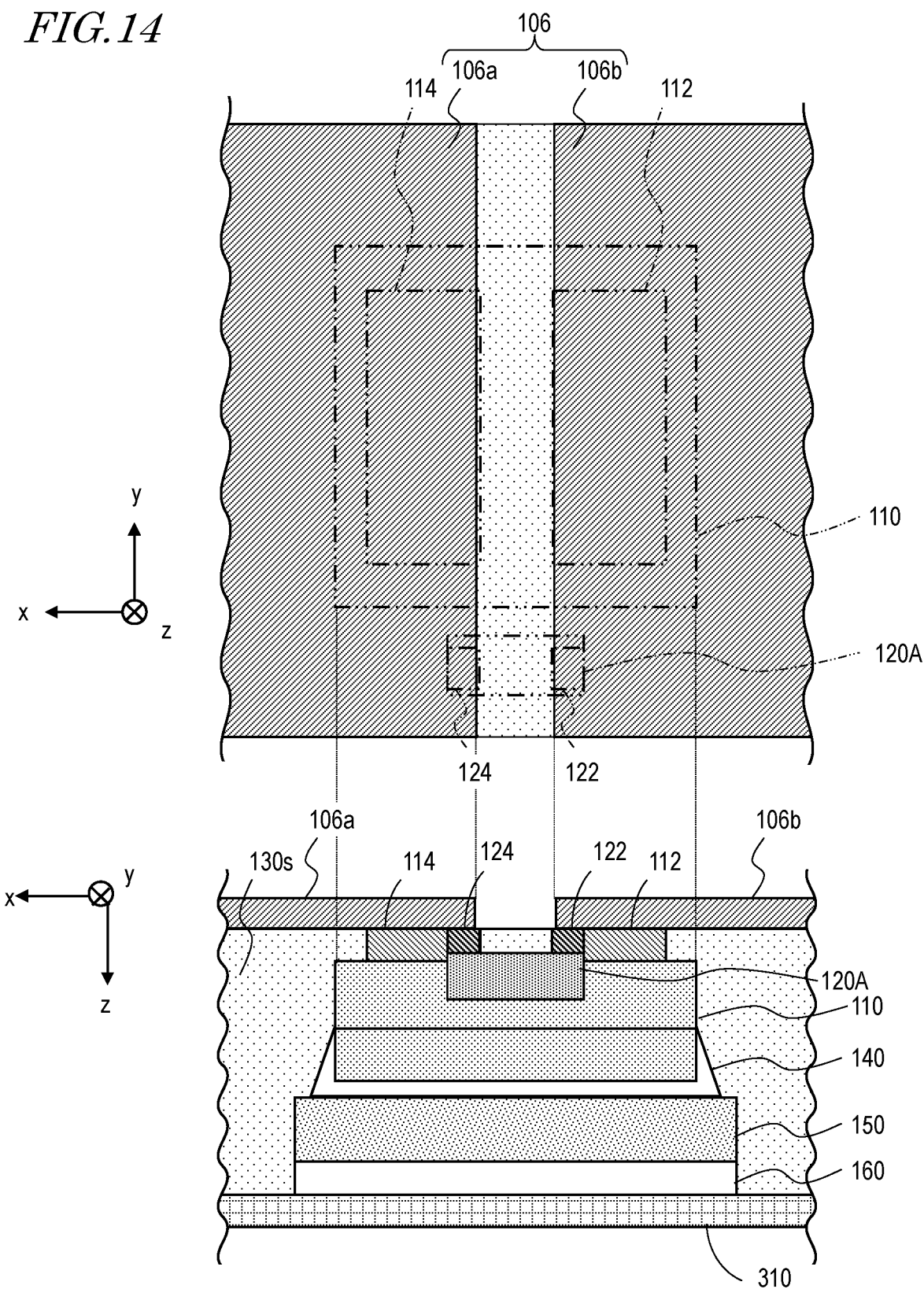
FIG. 14 is a diagram for illustrating a step in a method of manufacturing a light-emitting device according to the first embodiment of the present disclosure.

Then, a portion of the electrically-conductive layer 106 is removed by using laser abrasion, photolithography, or the like, such that a portion of the electrically-conductive layer 106 covering the anode 112 of the light-emitting element 110 and the first terminal 122 of the protective element 120A and another portion of the electrically-conductive layer 106 covering the cathode 114 of the light-emitting element 110 and the second terminal 124 of the protective element 120A are separated from each other as shown in FIG. 14. In an example shown in FIG. 14, a portion of the electrically-conductive layer 106 is removed along the y direction, so that a first portion 106a of the electrically-conductive layer 106 which covers the anode 112 of the light-emitting element 110 and the first terminal 122 of the protective element 120A, and a second portion 106b of the electrically-conductive layer 106 which covers the cathode 114 of the light-emitting element 110 and the second terminal 124 of the protective element 120A are formed. An insulating material, such as a polyimide resin, may be further provided in a region between the first portion 106a and the second portion 106b by, for example, using a printing technique.

Figure 15:
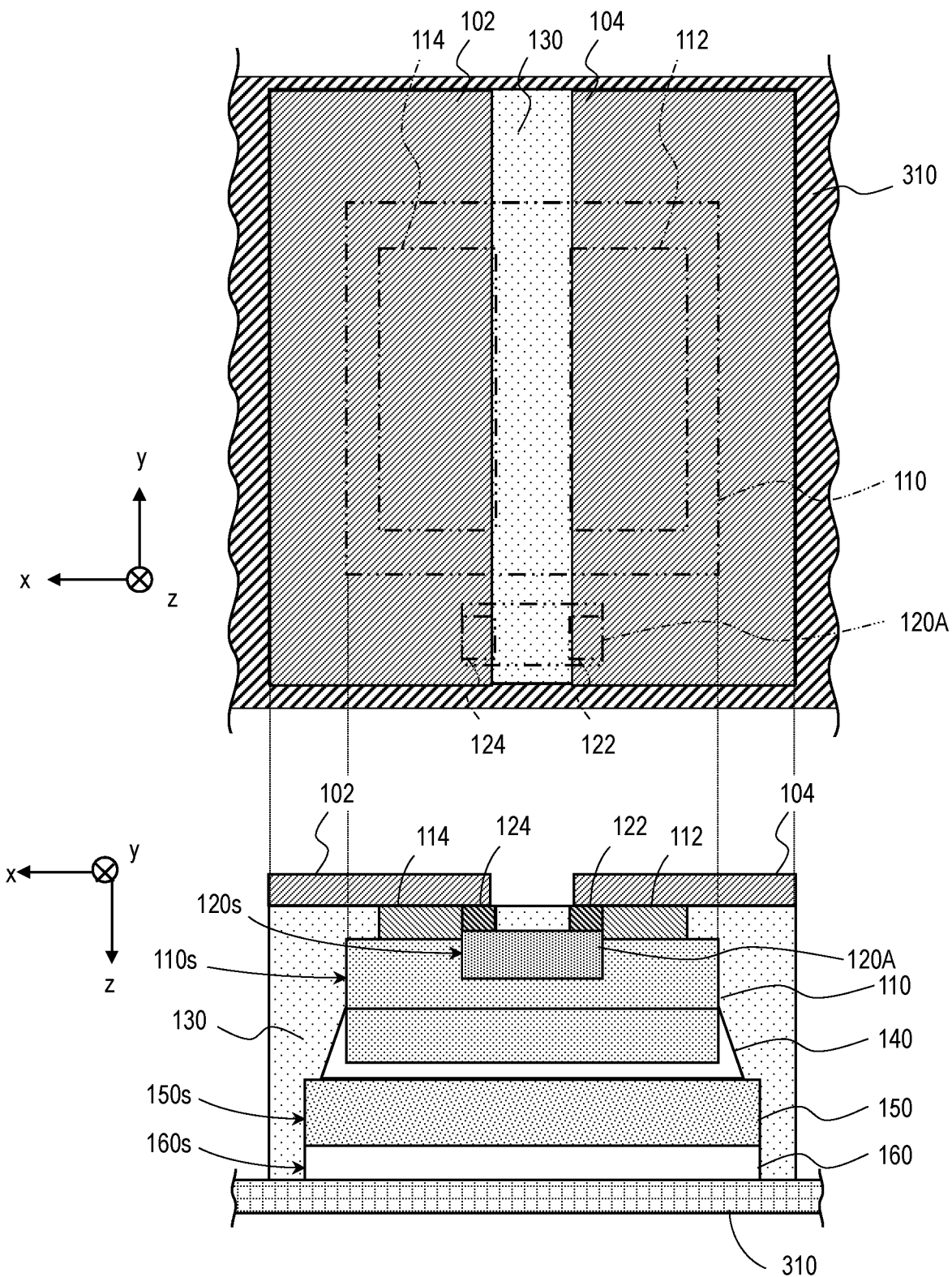
FIG. 15 is a diagram for illustrating a step in a method of manufacturing a light-emitting device according to the first embodiment of the present disclosure.

Then, as shown in FIG. 15, a portion of the resin layer 130s and a portion of the electrically-conductive layer 106 are removed in, for example, the x-axis direction and the y-axis direction by dicing or the like. By removing a portion of the resin layer 130s and a portion of the electrically-conductive layer 106, the light reflective resin layer 130 which covers the lateral portion 110s of the light-emitting element 110 and the lateral portion 120s of the protective element 120A can be formed. Further, the first electrode 102 that electrically couples the anode 112 of the light-emitting element 110 and the first terminal 122 of the protective element 120A with each other and the second electrode 104 that electrically connects the cathode 114 of the light-emitting element 110 and the second terminal 124 of the protective element 120A with each other can be formed (Step S6 of FIG. 5). As can be understood from FIG. 15, in this example, three of four lateral surfaces of the first electrode 102 each having a rectangular shape and three of four lateral surfaces of the second electrode 104 each having a rectangular shape are in alignment with the lateral surfaces of the light reflective resin layer 130.

By removing a portion of the resin layer 130s and a portion of the electrically-conductive layer 106, the structure on the supporting layer 310 is divided into a plurality of unit structures, each of which includes the at least one light-emitting element 110 and the at least one protective element 120A. By removing the supporting layer 310, the light-emitting device 100 is obtained which has been described above with reference to FIG. 1 and FIG. 2. The structure on the supporting layer 310 may be divided into unit structures each including a pair of the light-emitting element 110 and the protective element 120A. Alternatively, the structure on the supporting layer 310 may be divided into unit structures each including two or more protective elements 120A and two or more light-emitting elements 110.

Second Example

Figure 16:
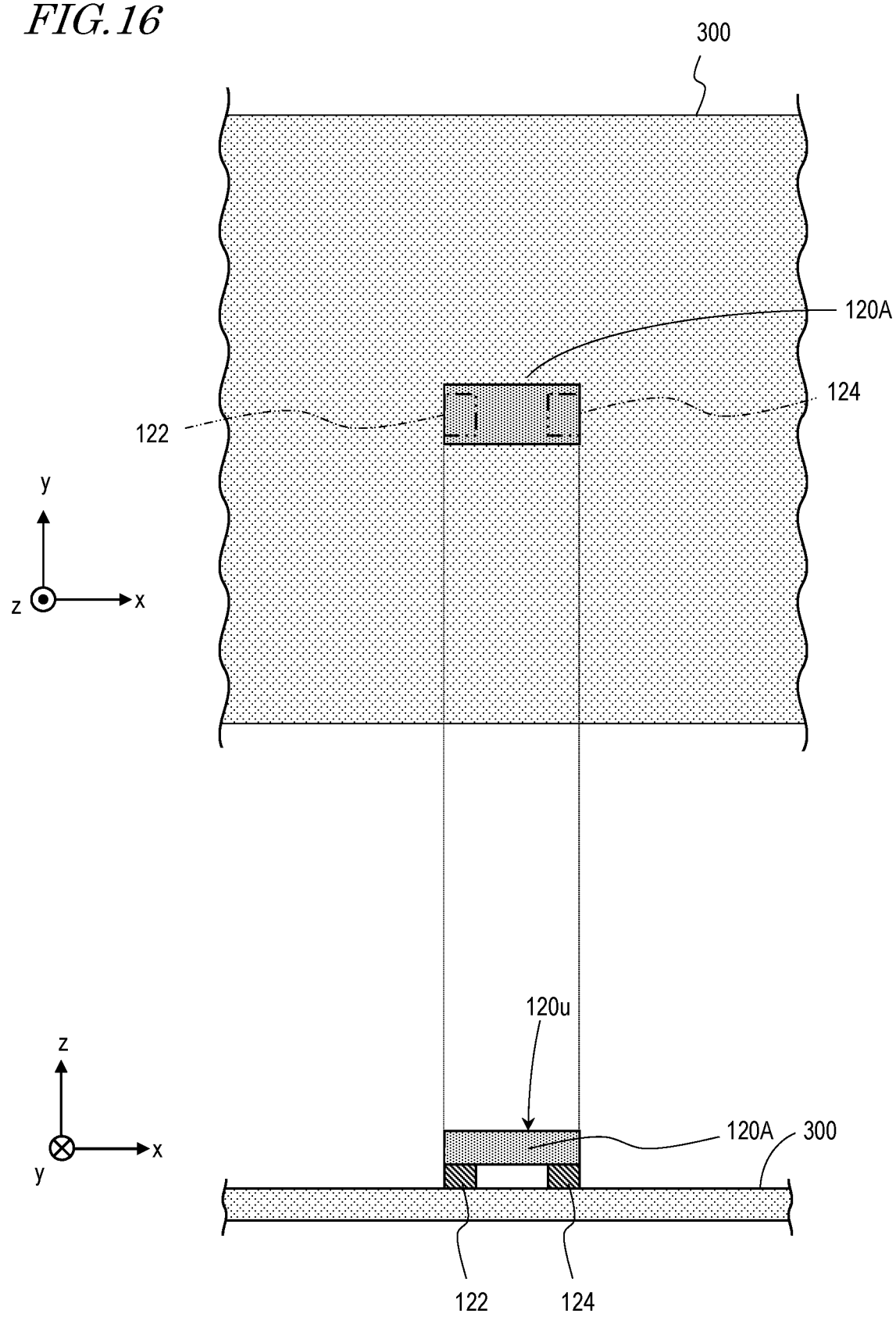
FIG. 16 is a diagram for illustrating a step in a method of manufacturing a light-emitting device according to the first embodiment of the present disclosure.
Figure 17:
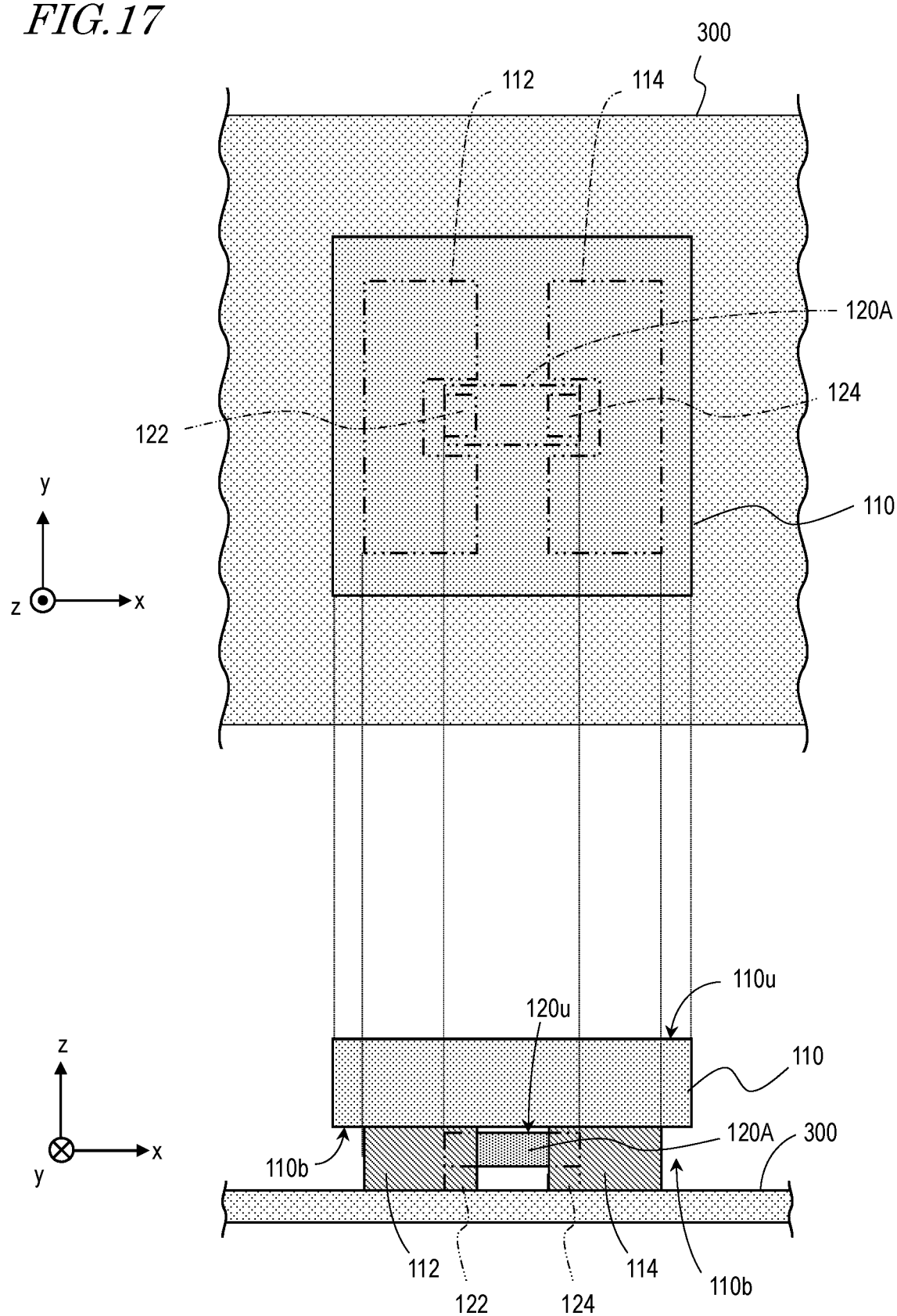
FIG. 17 is a diagram for illustrating a step in a method of manufacturing a light-emitting device according to the first embodiment of the present disclosure.

The structure described with reference to FIG. 3 and FIG. 4 can be obtained, for example, as described below. As shown in FIG. 16, first, a protective element 120A is placed on a supporting layer 300. Then, as shown in FIG. 17, a light-emitting element 110 is placed on the supporting layer 300 to cover the protective element 120A from the upper surface 120u side of the protective element 120A. At this time, as illustrated in the upper part of FIG. 17, for the light-emitting element 110, an element including an anode 112 and a cathode 114 each having a shape that do not physically interfere with the protective element 120A. In the case where the protective element 120A and the light-emitting element 110 are electrically insulated from each other, such as the case where an insulating layer is disposed at the upper surface 120u of the protective element 120A, the upper surface 120u of the protective element 120A and the lower surface 110b of the light-emitting element 110 may be in contact with each other.

Then, a protecting layer 160 is placed above the upper surface 110u of the light-emitting element 110. At this time, the protecting layer 160 may be formed on the upper surface 110u of the light-emitting element 110.

Figure 18:
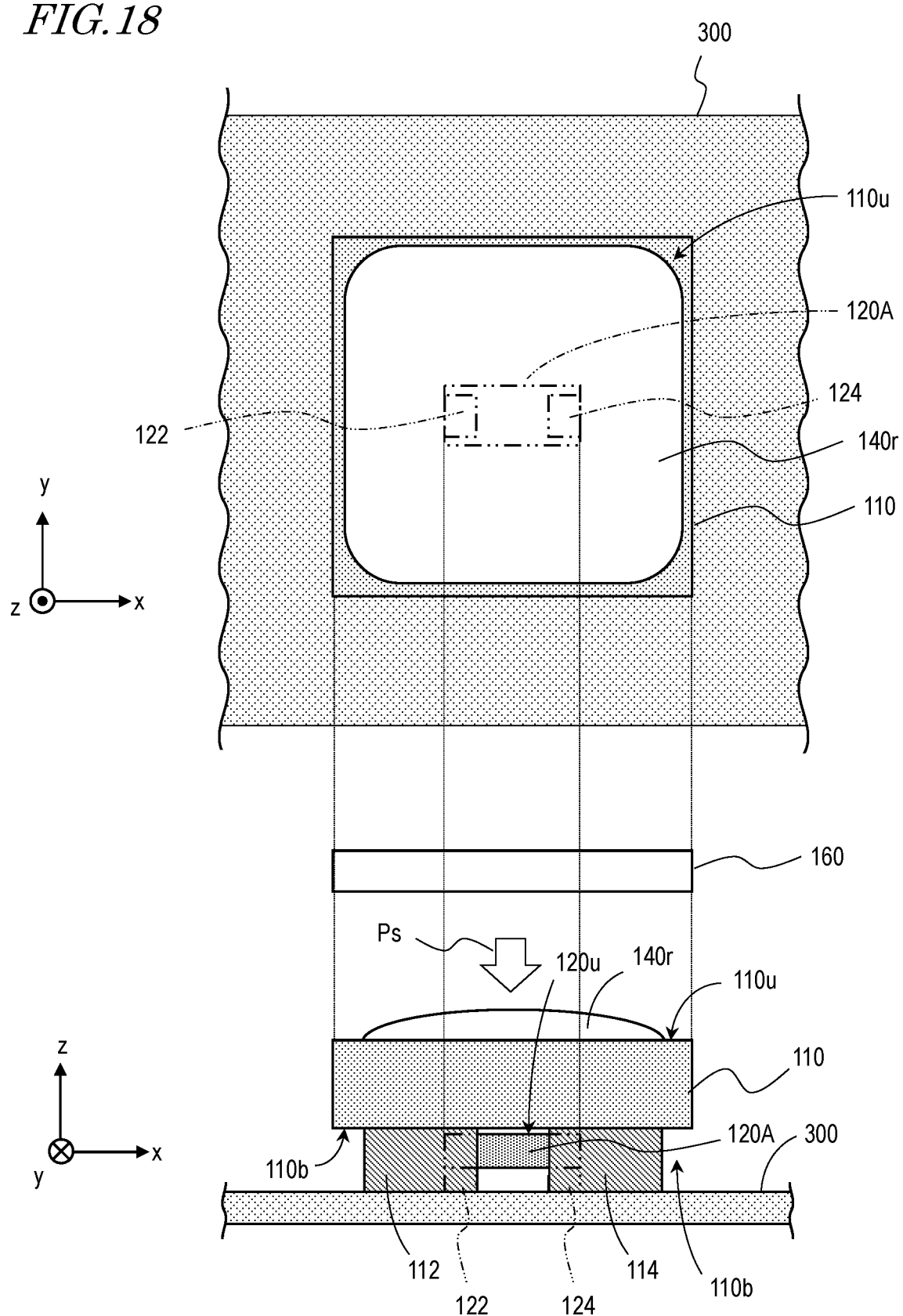
FIG. 18 is a diagram for illustrating a step in a method of manufacturing a light-emitting device according to the first embodiment of the present disclosure.
Figure 19:
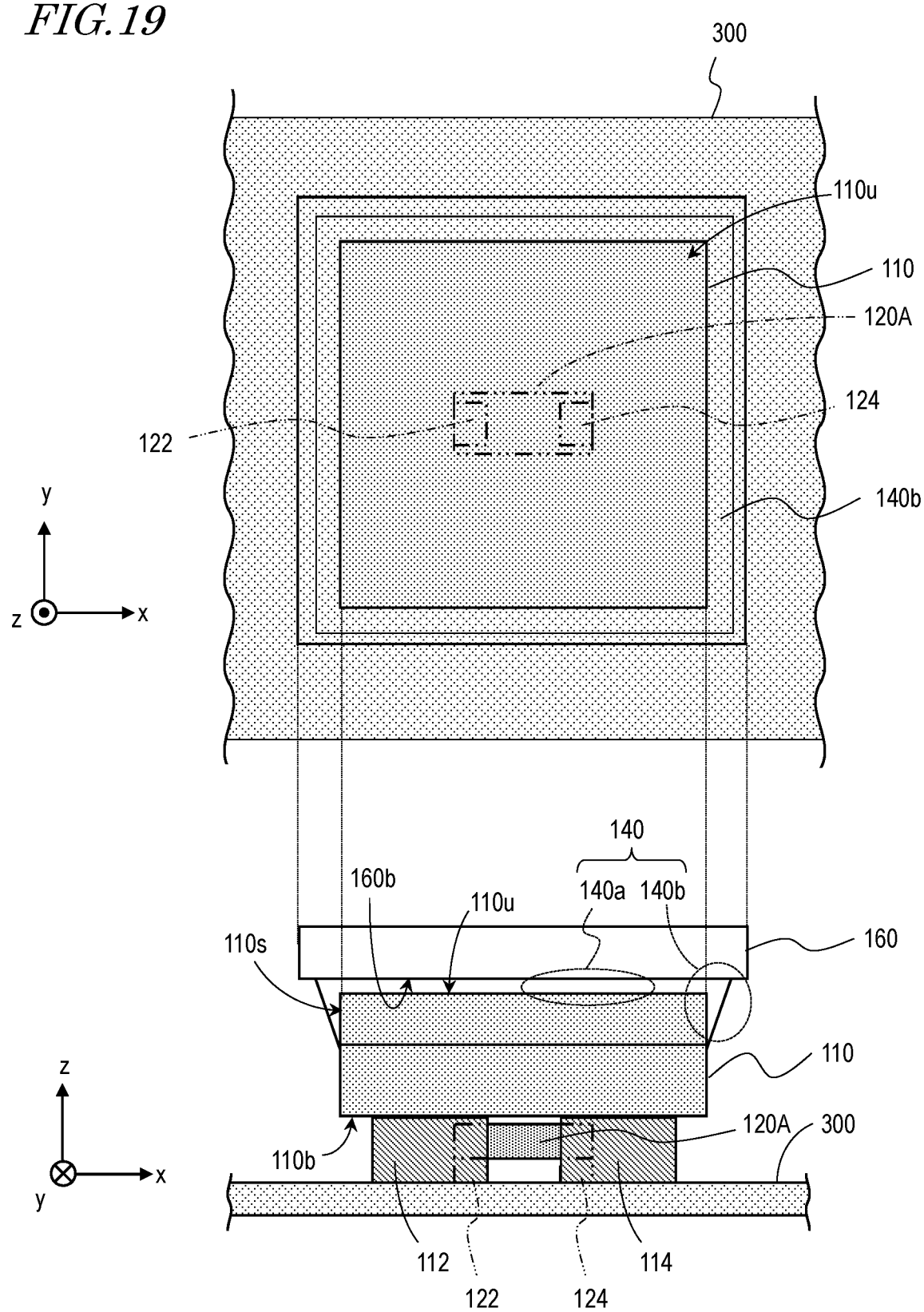
FIG. 19 is a diagram for illustrating a step in a method of manufacturing a light-emitting device according to the first embodiment of the present disclosure.

Alternatively, as illustrated in FIG. 18, after an uncured light-transmitting adhesive agent 140r is applied onto the upper surface 110u of the light-emitting element 110, the protecting layer 160 may be placed on the light-transmitting adhesive agent 140r. The subsequent steps are the same as those in the first example, which have been described above with reference to FIG. 10 to FIG. 15. At the time of placing the protecting layer 160 above the upper surface 110u of the light-emitting element 110, a light guide 140 may be formed by, for example, disposing the light-transmitting adhesive agent 140r between the upper surface 110u of the light-emitting element 110 and the protecting layer 160 as shown in FIG. 19 and performing curing. In the configuration illustrated in FIG. 19, the first light guide portion 140a is disposed between the lower surface 160b of the protecting layer 160 and the upper surface 110u of the light-emitting element 110.

According to the first and second examples described above, a light-emitting device in which the area of an electrode for supply of power is increased can be obtained without complicating manufacturing steps. Thus, according to certain embodiments of the present disclosure, for example, wirings of a mounting substrate does not need to have a complicated structure, so that a small-sized light-emitting device can be provided which can be relatively easily mounted.

As described with reference to FIG. 16 to FIG. 19, it is possible that, after the protective element 120A is placed on the supporting layer 300, the light-emitting element 110 is placed on the supporting layer 300 to cover the protective element 120A. With arrangement of the protective element 120A such that the entirety of the protective element 120A overlaps the light-emitting element 110, the size of the light-emitting device can be further reduced. A shape of each of the anode 112 and the cathode 114 of the light-emitting element 110 are not limited to the C-shape such as shown in FIG. 17, but may be appropriately selected to be a shape that does not physically interfere with the protective element 120A.

Further, according to certain embodiments of the present disclosure, the second light guide portion 140b can be formed on at least a portion of each of the lateral surfaces connecting between the upper surface 110u and the lower surface 110b of the light-emitting element 110. With the second light guide portion 140b, light emitted from the lateral portion 110s of the light-emitting element 110 can be utilized, and a light-emitting device with higher luminance can be provided. As described above, the border between the second light guide portion 140b and the light reflective resin layer 130 does not need to be linear in a cross-sectional view.

For example, the border can be a curve which is convex outward (i.e., toward the light reflective resin layer 130) or a curve which is convex inward (i.e., toward the light-emitting element 110). Further, a light-emitting device in which the wavelength conversion layer 150 is disposed between the upper surface 110u of the light-emitting element 110 and the protecting layer 160 can be obtained relatively easily. Therefore, a light-emitting device can be easily provided which can emit light having a wavelength different from that of light emitted from the light-emitting element 110.

Third Example

Figure 20:
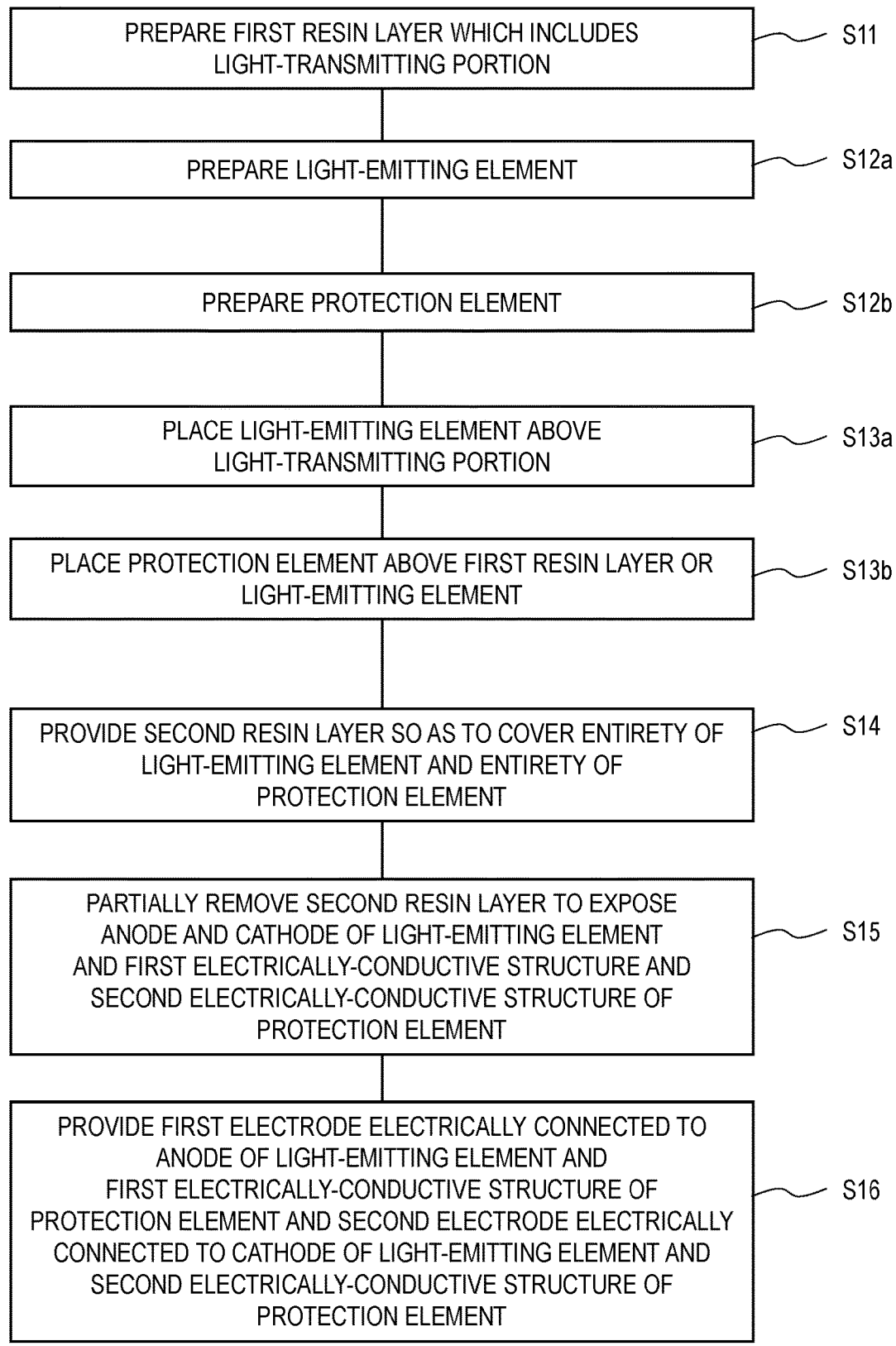
FIG. 20 is a flowchart illustrating the outline of a method of manufacturing a light-emitting device according to a second embodiment of the present disclosure.

Hereinafter, a method of manufacturing a light-emitting device according to a second embodiment of the present disclosure is described with reference to FIG. 20 to FIG. 37. FIG. 20 is a flowchart illustrating the outline of a method of manufacturing a light-emitting device according to the second embodiment of the present disclosure. FIG. 21 to FIG. 37 are diagrams for illustrating steps in a method of manufacturing the light-emitting device according to the second embodiment of the present disclosure.

Figure 21:
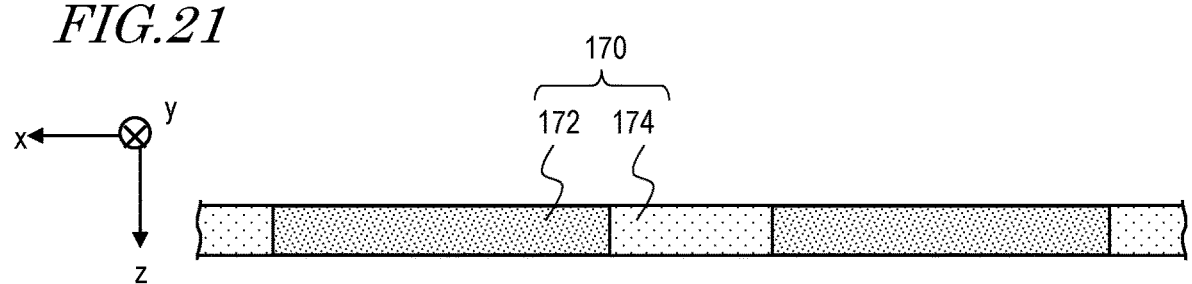
FIG. 21 is a schematic cross-sectional view for illustrating the method of manufacturing a light-emitting device according to the second embodiment of the present disclosure.
Figure 22:
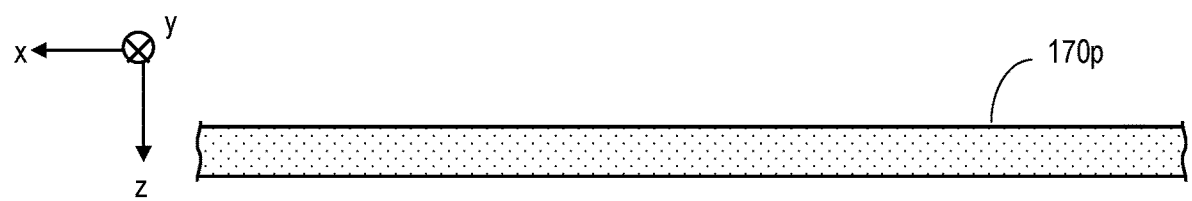
FIG. 22 is a schematic cross-sectional view for illustrating the method of manufacturing a light-emitting device according to the second embodiment of the present disclosure.

First, as shown in FIG. 21, a first resin layer 170 is provided which includes a light-transmitting portion 172 (Step S11 of FIG. 20). The first resin layer 170 can include two or more light-transmitting portions 172. In the configuration illustrated in FIG. 21, the first resin layer 170 includes a light reflective resin portion 174.

The light-transmitting portions 172 are separated from one another by the light reflective resin portion 174. The material that forms the light reflective resin portion 174 can be the same as the above-described material of the resin layer 130s. In FIG. 21, two light-transmitting portions 172 aligned in the x direction are shown, but the number and arrangement of the light-transmitting portions 172 are not limited thereto. For example, in the first resin layer 170, a plurality of light-transmitting portions 172 can be arranged along the y direction.

Figure 23:
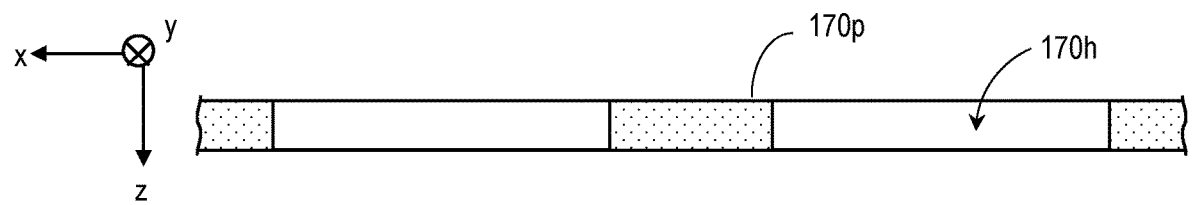
FIG. 23 is a schematic cross-sectional view for illustrating the method of manufacturing a light-emitting device according to the second embodiment of the present disclosure.

The first resin layer 170 can be obtained by, for example, providing a resin substrate 170p in which a light reflective filler is dispersed (see FIG. 22), forming holes 170h in the resin substrate 170p as shown in FIG. 23, thereafter filling the holes 170h with a resin composition by a potting technique or the like, and curing the resin composition. Using, for example, a transparent resin composition for the resin composition allows for obtaining the first resin layer 170 which includes transparent light-transmitting portions. A material used for the transparent light-transmitting portions can be the same as the material used for the above-described protecting layer 160.

A resin material in which a phosphor is dispersed may be used for the light-transmitting portions 172. Filling the holes 170h with a resin material in which a phosphor is dispersed allows for forming wavelength conversion portions as the light-transmitting portions 172. A material used for the wavelength conversion portions can be the same as the material used for the above-described wavelength conversion layer 150. In each of the holes 170h, a light-transmitting layer and a layer of the wavelength conversion portions may be formed sequentially. Accordingly, at least a portion of the light-transmitting portions 172 may include the wavelength conversion portions.

Figure 24:
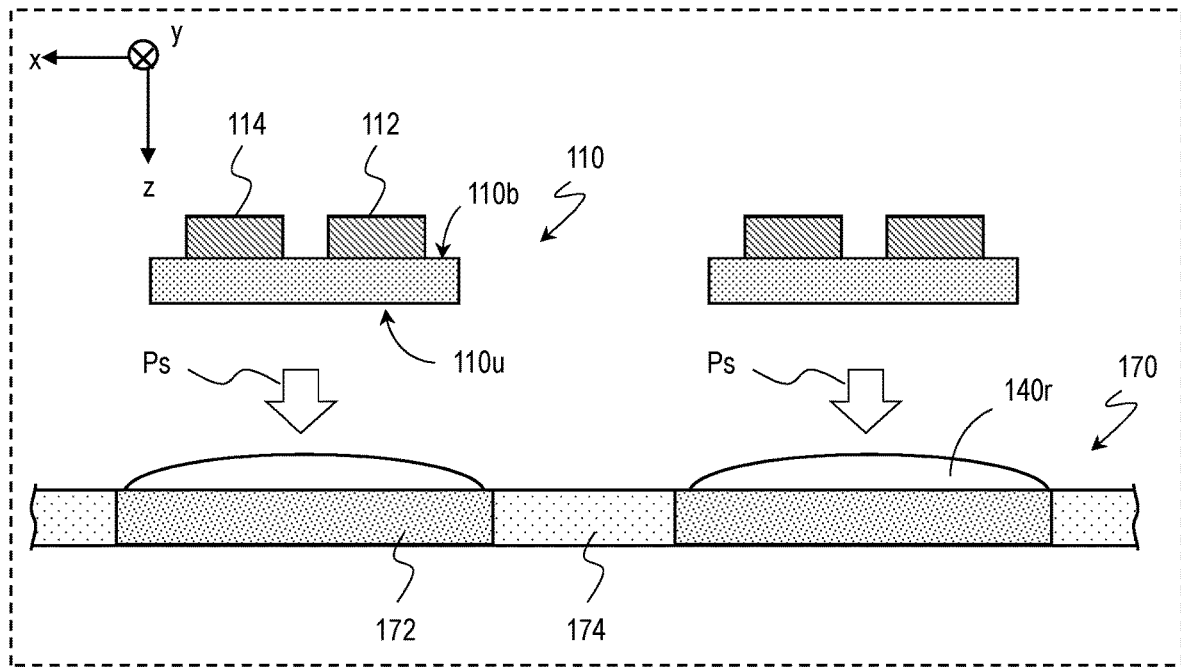
FIG. 24 is a schematic cross-sectional view for illustrating the method of manufacturing a light-emitting device according to the second embodiment of the present disclosure.
Figure 25:
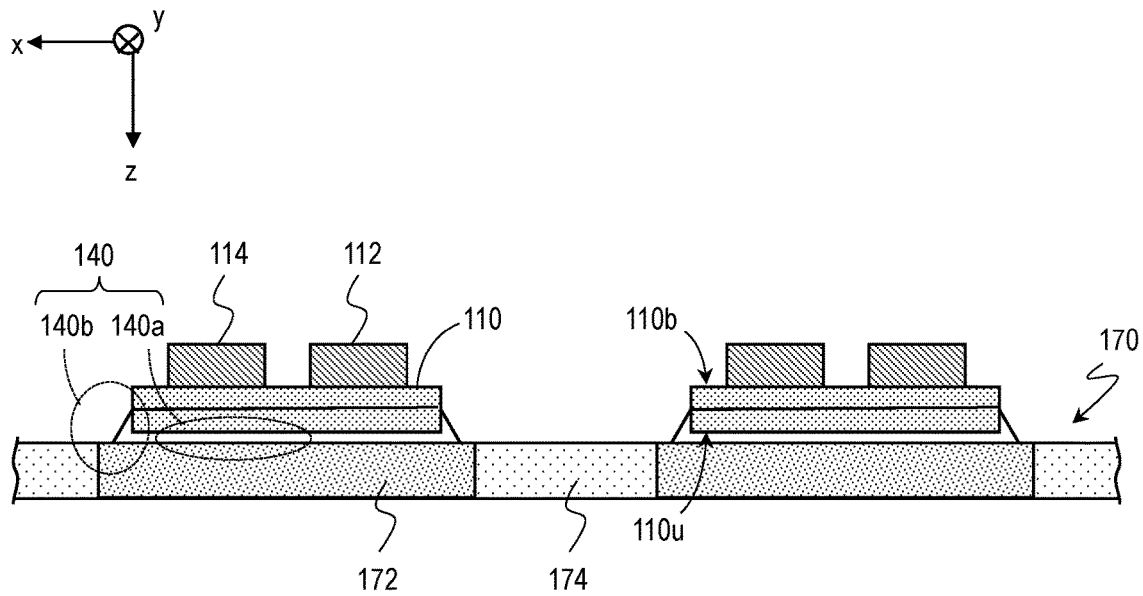
FIG. 25 is a schematic cross-sectional view for illustrating the method of manufacturing a light-emitting device according to the second embodiment of the present disclosure.

Then, light-emitting elements 110 are provided (Step S12a of FIG. 20), and respectively placed above respective one of the light-transmitting portions 172 such that the lower surface 110b, on which the anode 112 and the cathode 114 are provided, of each of the light-emitting elements faces a side opposite the first resin layer 170, as shown in FIG. 24 (Step S13a of FIG. 20). At this time, an uncured light-transmitting adhesive agent 140r may be applied onto the light-transmitting portions 172 of the first resin layer 170, and each of the light-emitting elements 110 may be placed on a region of respective one of the light-transmitting portions 172 to which the light-transmitting adhesive agent 140r is applied. Thereafter, the light-transmitting adhesive agent 140r is cured, so that light guides 140 can be formed on respective one of the light-transmitting portions 172 as shown in FIG. 25. Each of the light guides 140 can include a second light guide portion 140b on at least a portion of each of the lateral surfaces of respective one of the light-emitting elements 110 connecting the upper surface 110u and the lower surface 110b of the respective one of the light-emitting elements 110.

Then, as shown in FIG. 26, protective elements 120B are prepared each including a first electrically-conductive structure 126B and a second electrically-conductive structure 128B (Step S12b of FIG. 20). The first electrically-conductive structure 126B and the second electrically-conductive structure 128B are disposed at, for example, a lower surface 120b side of the respective one of the protective elements 120B. In the configuration illustrated in FIG. 26, the first electrically-conductive structure 126B includes a first terminal 122 that is disposed at a lower surface 120b side and a first electrically-conductive member 122b that is connected to the first terminal 122. The second electrically-conductive structure 128B includes a second terminal 124 that is disposed at a lower surface 120b side and a second electrically-conductive member 124b that is connected to the second terminal 124. It is not necessary that all of the first terminal 122, the second terminal 124, the first electrically-conductive member 122b and the second electrically-conductive member 124b are disposed on the lower surface 120b.

In this example, each of the first electrically-conductive member 122b and the second electrically-conductive member 124b has a structure in which spherical Au bumps are stacked. Each of the first electrically-conductive member 122b and the second electrically-conductive member 124b can include two or more Au bumps. Instead of the plurality of Au bumps, a Cu pillar or a ball in which a core of a metal, such as Cu, is covered by an alloy layer may be used for each of the first electrically-conductive member 122b and the second electrically-conductive member 124b. The configuration of each of the protective elements 120B can be the same as that of the above-described protective element 120A except for the first electrically-conductive member 122b and the second electrically-conductive member 124b. In other words, the first electrically-conductive structure 126B and the second electrically-conductive structure 128B are formed by connecting the first electrically-conductive member 122b and the second electrically-conductive member 124b with the first terminal 122 and the second terminal 124, respectively, of the above-described protective element 120A, so that the protective element 120B including the first electrically-conductive structure 126B and the second electrically-conductive structure 128B can be obtained.

Figure 27A:
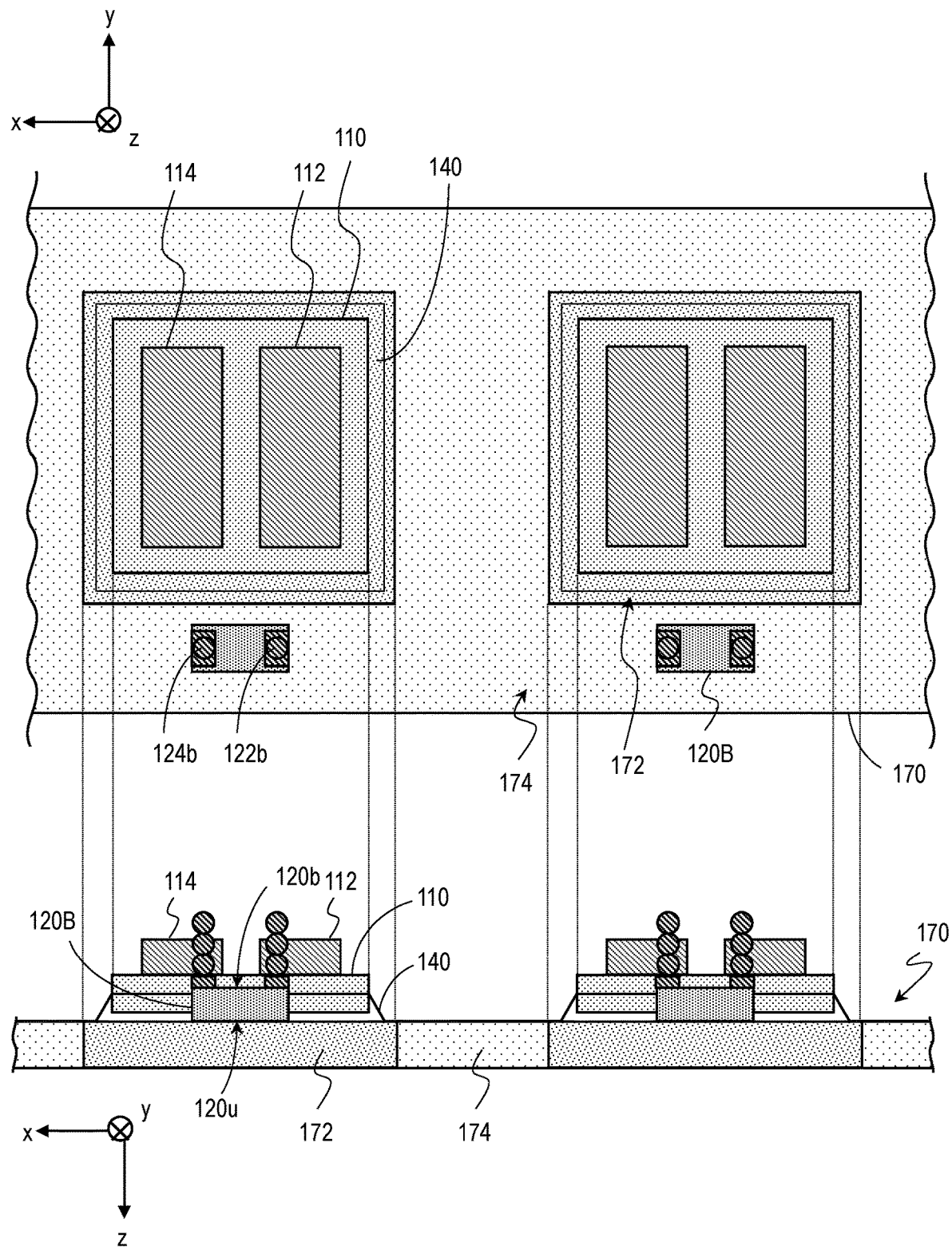
FIG. 27A is a diagram for illustrating the method of manufacturing a light-emitting device according to the second embodiment of the present disclosure.

Then, as shown in the lower part of FIG. 27A, the protective elements 120B are placed on or above the first resin layer 170 such that the lower surface 120b of each of the protective elements 120B faces a side opposite the first resin layer 170 (Step S13b of FIG. 20). In FIG. 27A, a schematic plan view and a schematic side view are shown together. As illustrated in the upper part of FIG. 27A, in the present example, the protective elements 120B are placed on the light reflective resin portion 174 of the first resin layer 170. As schematically shown in the lower part of FIG. 27B, a layer 142 of an adhesive agent or the like can be disposed between the upper surface 120u of each of the protective elements 120B and the first resin layer 170.

Figure 27B:
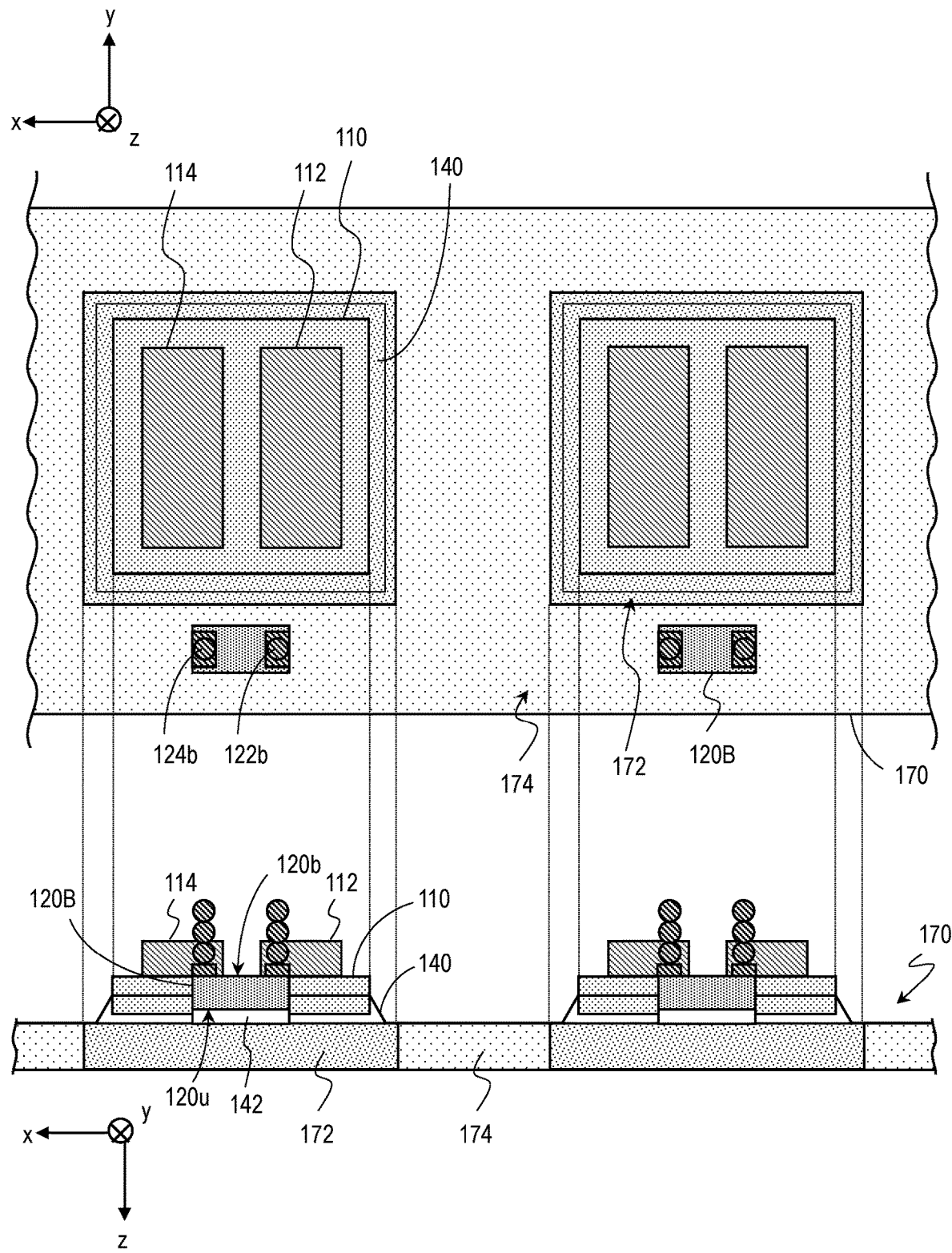
FIG. 27B is a diagram for illustrating a variant example of the light-emitting device manufacturing method of the second embodiment of the present disclosure.

The arrangement of the protective elements 120B is not limited to this example. For example, each of the protective elements 120B may be disposed over respective one of the light-transmitting portions 172 and the light reflective resin portion 174 of the first resin layer 170. Alternatively, each of the protective elements 120B can be disposed on respective one of the light-transmitting portions 172 of the first resin layer 170 such that each of the protective elements 120B does not overlap respective one of the light-emitting elements 110. However, with an arrangement in which the entirety or a part of each of the protective elements 120B is located above the light-transmitting portion 172, light passing through the light-transmitting portion 172 is absorbed by the protective elements 120B. With the protective elements 120B disposed above the first resin layer 170 such that the upper surface 120u of each of the protective elements 120B and respective one of the light reflective resin portions 174 face each other as in the example of FIG. 27A, absorption of light by the upper surface 120u of each of the protective elements 120B can be prevented. Therefore, in view of the light utilization efficiency, it is advantageous that, as illustrated in FIG. 27A and FIG. 27B, each of the light-emitting elements 110 is placed on or above respective one of the light-transmitting portions 172 of the first resin layer 170 and the protective elements 120B is placed on or above the light reflective resin portion 174.

Figure 28:
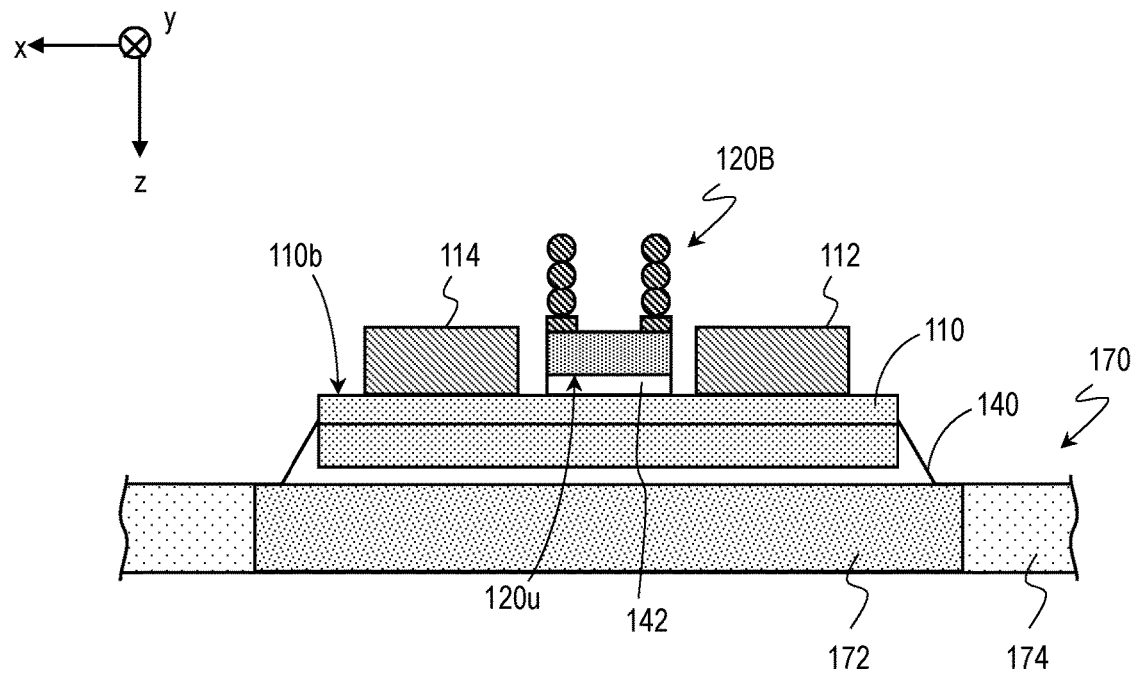
FIG. 28 is a schematic cross-sectional view for illustrating the method of manufacturing a light-emitting device according to the second embodiment of the present disclosure.

As shown in FIG. 28, the protective element 120B may be placed on or above the lower surface 110b of the light-emitting element 110. As schematically shown in FIG. 28, a layer 142 of an adhesive agent or the like can be arranged between the protective element 120B and the light-emitting element 110. In other words, the protective element 120B and the light-emitting element 110 can be bonded together via an insulating layer, an insulative adhesive agent, or the like. The protective element 120B and the lower surface 110b of the light-emitting element 110 are insulated from each other. When an insulating layer is disposed at the upper surface 120u of the protective element 120B, the upper surface 120u of the protective element 120B and the lower surface 110b of the light-emitting element 110 may be in contact with each other. Securing the protective element 120B at a position overlapping the light-emitting element 110 in a plan view allows for obtaining a smaller light-emitting device. For example, the entirety of the protective element 120B is located on or above the lower surface 110b of the light-emitting element 110. The protective element 120B may be arranged such that a portion of the protective element 120B extends beyond the perimeter of the lower surface 110b of the light-emitting element 110.

Figure 29:
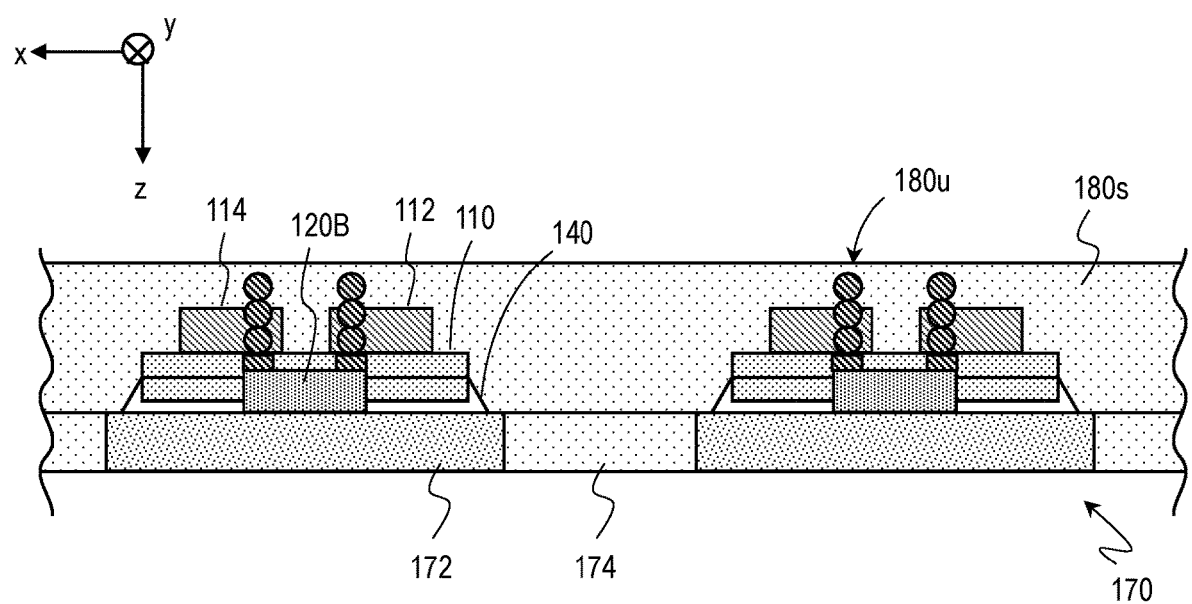
FIG. 29 is a schematic cross-sectional view for illustrating the method of manufacturing a light-emitting device according to the second embodiment of the present disclosure.

Then, a resin composition is applied onto the first resin layer 170 and, thereafter, the resin composition is cured, so that a second resin layer 180s is formed on the first resin layer 170 to cover the entirety of the light-emitting elements 110 and the entirety of the protective elements 120B as shown in FIG. 29 (Step S14 of FIG. 20). The resin composition used for the second resin layer 180s can be the same as the resin composition used for the above-described resin layer 130s.

Figure 30:
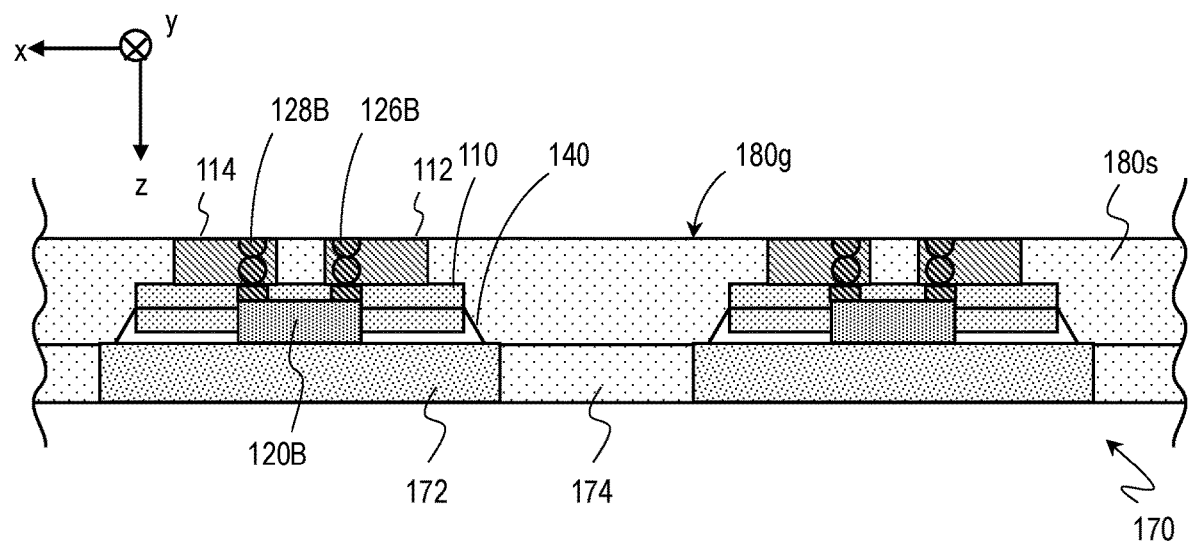
FIG. 30 is a schematic cross-sectional view for illustrating the method of manufacturing a light-emitting device according to the second embodiment of the present disclosure.

Then, a portion of the second resin layer 180s is removed such that the anode 112 and the cathode 114 of each of the light-emitting elements 110 and the first electrically-conductive structure 126B and the second electrically-conductive structure 128B of each of the protective elements 120B are exposed from the second resin layer 180s (Step S15 of FIG. 20). For example, the second resin layer 180s is ground from the upper surface 180u side of the second resin layer 180s (i.e., the side opposite the first resin layer 170, see FIG. 29) toward the first resin layer 170, so that a light reflective resin layer 180 having a ground surface 180g is formed. By the grinding, as shown in FIG. 30, the anode 112 and the cathode 114 of each of the light-emitting elements 110 and the first electrically-conductive structure 126B and the second electrically-conductive structure 128B of each of the protective elements 120B are exposed at the ground surface 180g.

Figure 31:
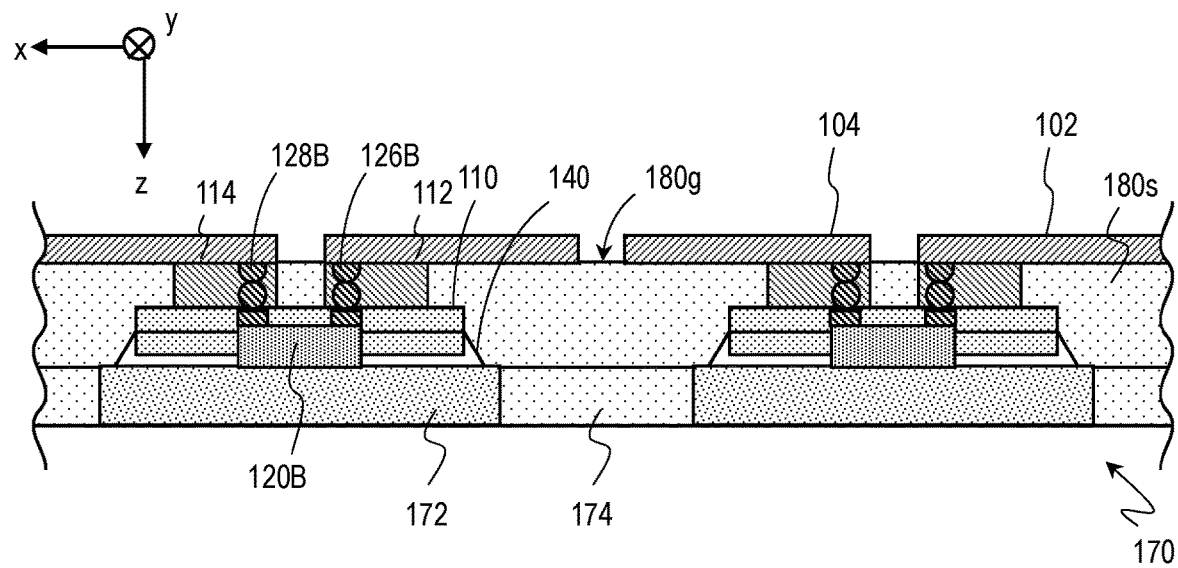
FIG. 31 is a schematic cross-sectional view for illustrating the method of manufacturing a light-emitting device according to the second embodiment of the present disclosure.

Then, as shown in FIG. 31, first electrodes 102 each electrically connecting the anode 112 of each of the light-emitting elements 110 and the first electrically-conductive structure 126B of respective one of the protective elements 120B together, and second electrodes 104 each electrically connecting the cathode 114 of each of the light-emitting elements 110 and the second electrically-conductive structure 128B of respective one if the protective elements 120B together are formed (Step S16 of FIG. 20). For example, an electrically-conductive layer is formed to cover the entirety of the ground surface 180g, and a portion of the electrically-conductive layer located above a region between the anode 112 and the cathode 114 and another portion of the electrically-conductive layer located above a region between the first electrically-conductive structure 126B and the second electrically-conductive structure 128B are selectively removed. At this time, a portion of the electrically-conductive layer above a region between light-emitting devices that are to be obtained may be removed.

As described above, by removing such an unnecessary portion of the electrically-conductive layer, each of the first electrodes 102 and each of the second electrodes 104 can be formed on the ground surface 180g with respect to each of the light-emitting elements 110 and respective one of the protective elements 120B, as in the example that has been described above with reference to FIG. 14 and FIG. 15. By formation of the first electrodes 102, the anode 112 of each of the light-emitting elements 110 and the first electrically-conductive structure 126B of respective one of the protective elements 120B are electrically connected with each other.

By formation of the second electrodes 104, the cathode 114 of each of the light-emitting elements 110 and the electrically-conductive structure 128 of respective one of the protective elements 120B are electrically connected with each other.

Figure 32:
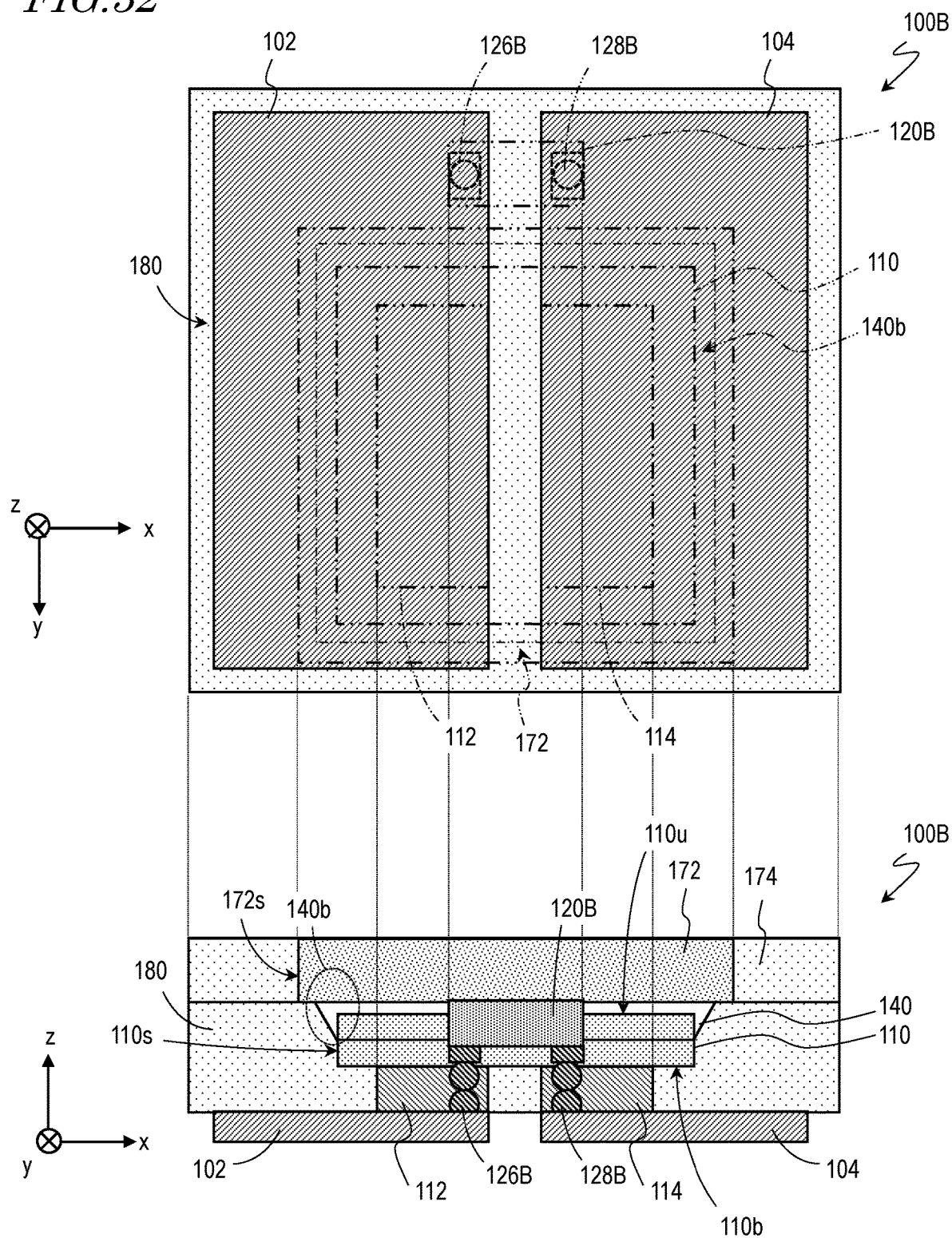
FIG. 32 is a schematic diagram showing an exemplary configuration of a light-emitting device obtained by the method of manufacturing according to the second embodiment of the present disclosure.

Then, the structure obtained after formation of the first electrodes 102 and the second electrodes 104 is divided into a plurality of unit structures by dicing or the like. For example, the division is carried out such that each unit includes a set of the light-emitting element 110 and the protective element 120B, so that a light-emitting device 100B is obtained that has a configuration shown in FIG. 32. In FIG. 32, a schematic plan view and a schematic cross-sectional view are shown. Removing the electrically-conductive layer on dicing streets as shown in FIG. 31 allows for efficiently performing the division by dicing.

In the configuration illustrated in FIG. 32, the first electrode 102 of the light-emitting device 100B covers the anode 112 of the light-emitting element 110 and the first electrically-conductive structure 126B of the protective element 120B, and electrically connects the anode 112 and the first electrically-conductive structure 126B with each other. The second electrode 104 covers the cathode 114 of the light-emitting element 110 and the second electrically-conductive structure 128B of the protective element 120B, and electrically couples the cathode 114 and the second electrically-conductive structure 128B with each other. Therefore, with the first electrode 102 and the second electrode 104, the light-emitting element 110 and the protective element 120B can be connected electrically in anti-parallel.

As described hereinabove, with a method of manufacturing according to the present embodiment, a small-sized light-emitting device that can be relatively easily mounted can be provided without using complicated wirings on a substrate are formed, as in the embodiment that has been described above with reference to FIG. 5 to FIG. 19.

The protective element 120B used in the present example includes the first electrically-conductive structure 126B and the second electrically-conductive structure 128B. For example, the first electrically-conductive member 122b is connected on the first terminal 122 on the lower surface 120b side of the protective element 120B, and the second electrically-conductive member 124b is connected on the second terminal 124, so that the first electrically-conductive structure 126B and the second electrically-conductive structure 128B can be formed. Using the protective element 120B that includes the first electrically-conductive structure 126B and the second electrically-conductive structure 128B extending away from the lower surface 120b along a direction perpendicular to the lower surface 120b allows the first electrically-conductive structure 126B and the second electrically-conductive structure 128B and the anode 112 and the cathode 114 of the light-emitting element 110 to be exposed from the light reflective resin layer 180 by grinding, or the like, as described above with reference to FIG. 30. As previously described with reference to FIG. 28, if such a protective element 120B is placed above the lower surface 110b of the light-emitting element 110, the protective element 120B and the light-emitting element 110 are not disposed laterally adjacent to each other in the obtained light-emitting device 100B. That is, such an arrangement is advantageous for reduction in size.

In the configuration illustrated in FIG. 32, light emitted from the light-emitting element 110 is emitted toward an outside of the light-emitting device 100B through the light-transmitting portion 172. With the light-transmitting portion 172 partially or entirely made of a wavelength conversion layer that contains, for example, a phosphor, a light-emitting device can be provided that is adapted to radiate light of a wavelength different from that of the light emitted from the light-emitting element 110.

As schematically shown in the lower part of FIG. 32, in this example, a lateral portion 172s of the light-transmitting portion 172 is covered with the light reflective resin portion 174, and therefore, leakage of light from the lateral portion 172s of the light-transmitting portion 172 can be reduced. Also, the lateral portion 110s of the light-emitting element 110 is covered with the light reflective resin layer 180. With this arrangement, light emitted from the lateral surfaces of the light-emitting element 110 and extracted from the lateral portion of the light-emitting device 100B can be reduced, so that the light utilization efficiency can be improved. With a method of manufacturing according to the present embodiment, the light-emitting element 110 is placed on or above a region of the light-transmitting portion 172 to which a light-transmitting adhesive agent is applied, which allows the second light guide portion 140b to be relatively easily formed on a portion of each of the lateral surfaces of the light-emitting element 110. With the second light guide portion 140b, light emitted from the lateral surfaces of the light-emitting element 110 is guided to the light-transmitting portion 172. This allows for improving light utilization efficiency. In other words, the effect of improving the luminance of the light-emitting device 100B can be obtained. The border between the second light guide portion 140b and the light reflective resin layer 180 may be a curve in a cross-sectional view, as in the second light guide portion 140b of the above-described light guide 140. Further, in a method of manufacturing according to the present embodiment, the lower surface 110b of the light-emitting element 110 can be relatively easily covered with the light reflective resin layer 180. With the light reflective resin layer 180 formed to cover the lower surface 110b of the light-emitting element 110, emission of light from the lower surface 110b side can be reduced, so that the light utilization efficiency in the light-emitting device 100B can be improved.

Variant Example

The configuration of each of the first electrically-conductive member 122b and the second electrically-conductive member 124b is not limited to the above-described examples. For example, a lead wire or the like can be used instead of the Au bumps.

Figure 33:
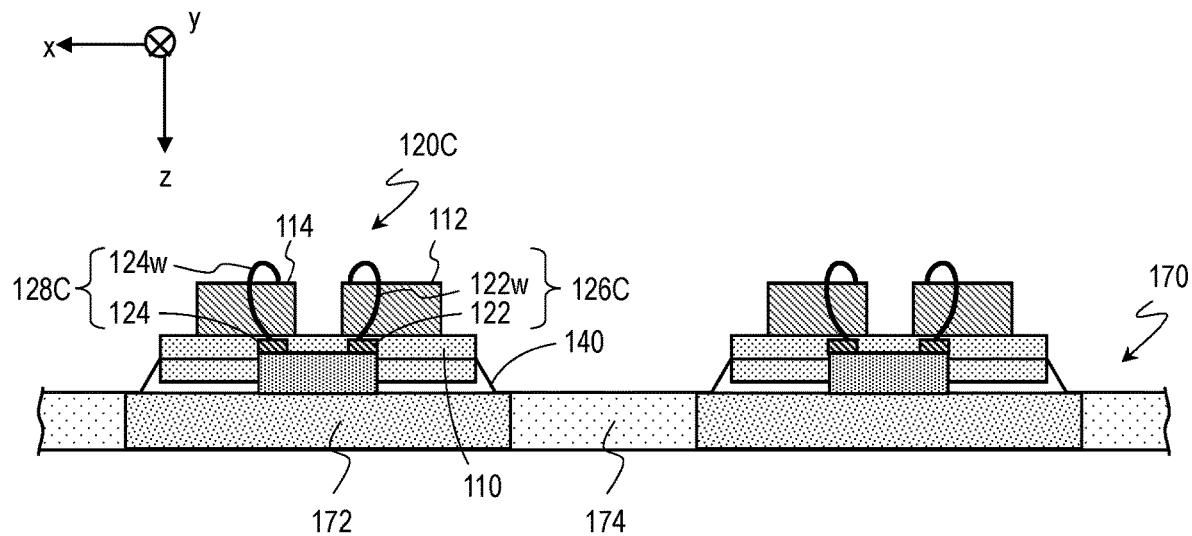
FIG. 33 is a schematic cross-sectional view showing a part of a manufacturing step of a light-emitting device in which a protective element is used that includes lead wires connected to terminals as a first electrically-conductive member and a second electrically-conductive member.

FIG. 33 shows a part of a method of manufacturing a light-emitting device in the case where a protective element 120C including lead wires connected to terminals to serve as a first electrically-conductive member 122w and a second electrically-conductive member 124w. FIG. 33 shows the light-emitting elements 110 respectively placed on respective one of the light-transmitting portions 172 of the first resin layer 170. FIG. 33 is a side view of the light-emitting elements 110 and the protective elements 120C that are on the first resin layer 170, and the protective elements 120C appears as if each being disposed on the light-transmitting portion 172 of the first resin layer 170, but the protective elements 120C are disposed on the light reflective resin portion 174 of the first resin layer 170 as in the example that has been described above with reference to FIG. 32. Such an arrangement allows for reducing absorption of light that has passed through the light-transmitting portion 172 by the protective elements 120C and thus improving light utilization efficiency.

In the configuration illustrated in FIG. 33, a first electrically-conductive structure 126C of each of the protective elements 120C includes the first terminal 122 and the first electrically-conductive member 122w, and a second electrically-conductive structure 128C of each of the protective elements 120C includes the second terminal 124 and the second electrically-conductive member 124w. The first electrically-conductive member 122w and the second electrically-conductive member 124w are, for example, Au wires. In this example, an end portion of the first electrically-conductive member 122w and an end portion of the second electrically-conductive member 124w are connected to the anodes 112 and 114 of each of the light-emitting elements 110, respectively. However, the first terminal 122 of each of the protective elements 120C may not be connected to the anode 112 of respective one of the light-emitting elements 110 via the first electrically-conductive member 122w. An end portion of the first electrically-conductive member 122w is located at a position higher than a surface of the anode 112. The same applies to the second electrically-conductive member 124w.

An end portion of the second electrically-conductive member 124w is located at a position higher than the surface of the cathode 114. The second terminal 124 of the protective element 120C may not be connected beforehand to the cathode 114 of the light-emitting element 110 via the second electrically-conductive member 124w.

Figure 34:
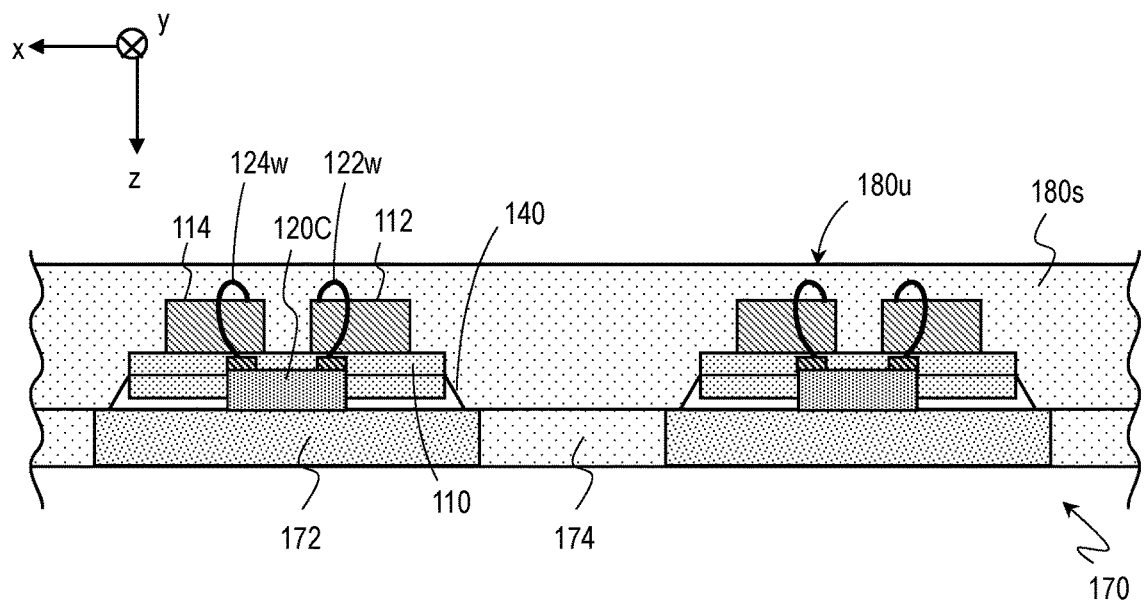
FIG. 34 is a schematic cross-sectional view for illustrating a step in the method of manufacturing a light-emitting device in which the protective element is used.
Figure 35:
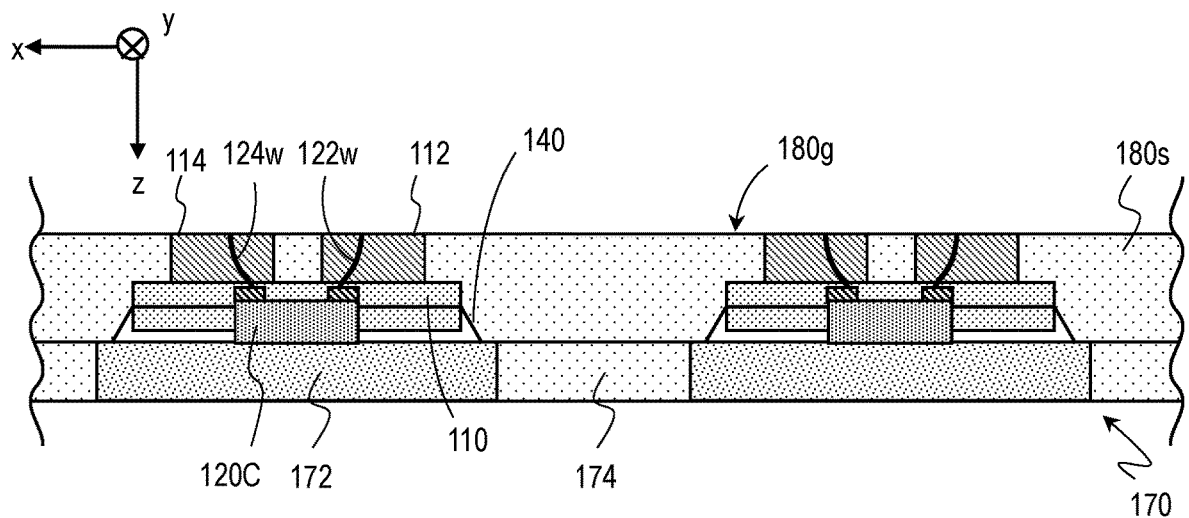
FIG. 35 is a schematic cross-sectional view for illustrating a step in the method of manufacturing a light-emitting device in which the protective element is used.

After placing the light-emitting elements 110 and the protective elements 120C, a second resin layer 180s is formed on the first resin layer 170 to cover the entirety of the light-emitting elements 110 and the entirety of the protective elements 120C as shown in FIG. 34. Then, as shown in FIG. 35, the second resin layer 180s is ground from the upper surface 180u side of the second resin layer 180s (i.e., the side opposite to the first resin layer 170) toward the first resin layer 170 till the anode 112 and the cathode 114 of each of the light-emitting elements 110 are exposed at the ground surface 180g. By the grinding, the first electrically-conductive member 122w, which is a part of the first electrically-conductive structure 126C, and the second electrically-conductive member 124w, which is a part of the second electrically-conductive structure 128C, are exposed at the ground surface 180g.

Figure 36:
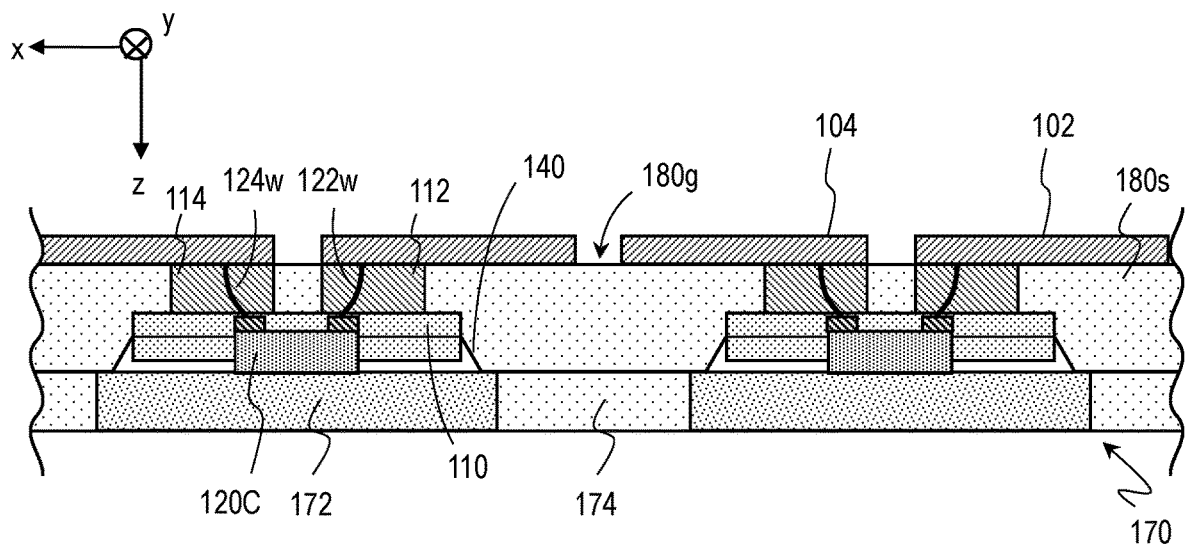
FIG. 36 is a schematic cross-sectional view for illustrating a step in the method of manufacturing a light-emitting device in which the protective element is used.

Then, as shown in FIG. 36, first electrodes 102 and second electrodes 104 are formed on the ground surface 180g such that each of the first electrodes 102 covers the anode 112 of respective one of the light-emitting elements 110 and the first electrically-conductive member 122w of respective first electrically-conductive structure 126C, which are exposed at the ground surface 180g, and each of the second electrodes 104 covers the cathode 114 of respective one of the light-emitting elements 110 and the second electrically-conductive member 124w of respective second electrically-conductive structure 128C, which are exposed at the ground surface 180g. Forming the first electrode 102 allows the anode 112 of each of the light-emitting elements 110 and the first electrically-conductive structure 126C of respective one of the protective elements 120C to be electrically connected with each other via the first electrode 102. Forming the second electrode 104 allows the cathode 114 of the light-emitting element 110 and the second electrically-conductive structure 128C of the protective element 120C to be electrically connected with each other via the second electrode 104.

Figure 37:
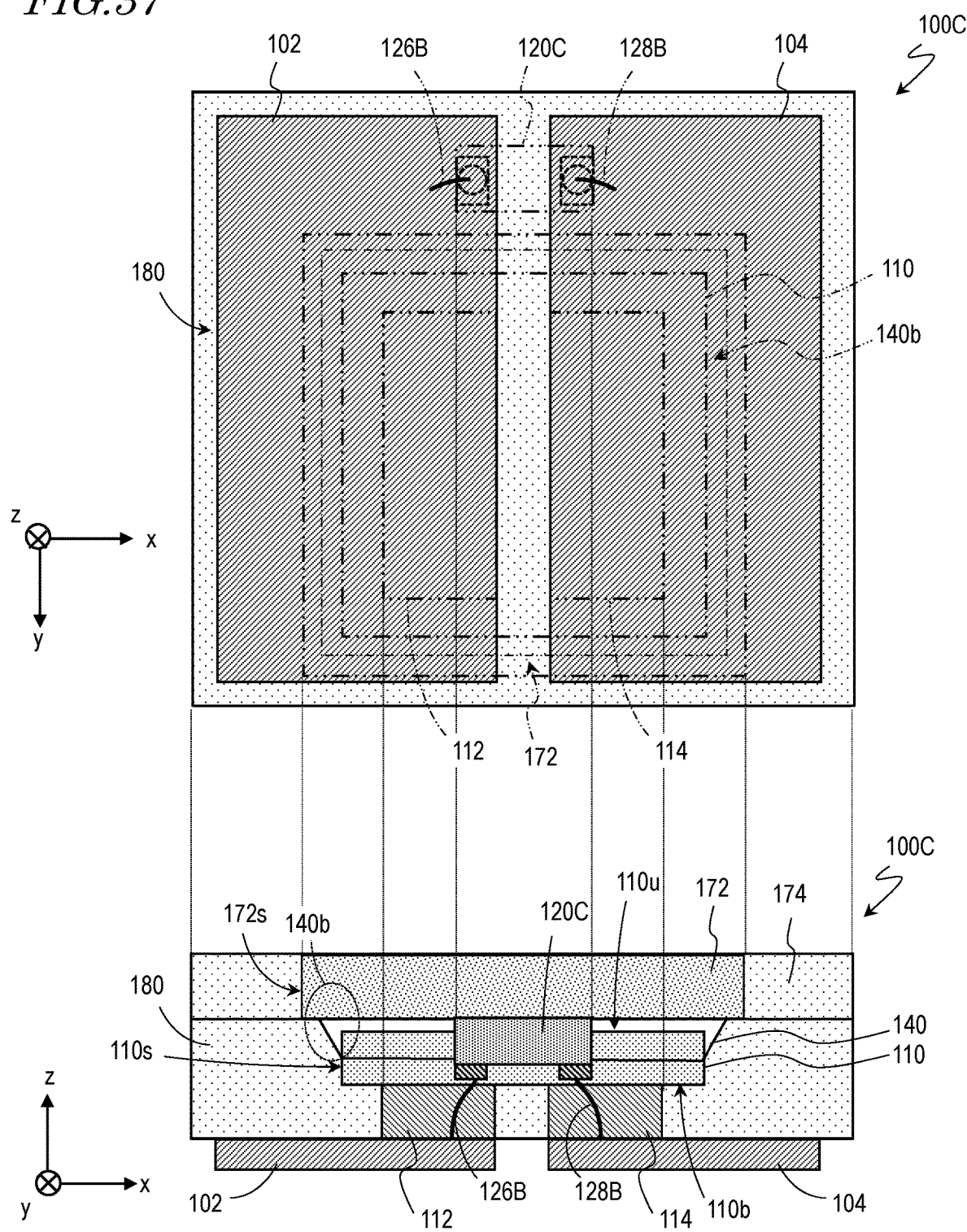
FIG. 37 is a schematic diagram showing an exemplary configuration of the light-emitting device that includes the protective element.

Further, by performing the division into a plurality of unit structures using a dicing technique or the like, a light-emitting device 100C shown in FIG. 37 is obtained. In FIG. 37, a schematic plan view and a schematic cross-sectional view are shown. Also in this example, each of the light-emitting elements 110 and respective one of the protective elements 120C can be connected electrically in anti-parallel by the first electrode 102 and the second electrode 104.

According to an embodiment of the present disclosure, a light-emitting device is provided in which a light-emitting element and a protective element are integrated while avoiding complicated process of manufacturing. According to an embodiment of the present disclosure, electrodes that electrically connect a light-emitting element and a protective element with each other is provided on a bottom surface side of a light-emitting device, and power is supplied to the light-emitting element and the protective element via these electrodes. Further, electrodes for supplying power each having an area greater than an area of each of the anode and cathode of the light-emitting element and an area of each of the terminals of the protective element are formed, so that alignment with the wiring board or the like can be facilitated. That is, a light-emitting device is provided that can be easily mounted to the wiring board or the like. An embodiment of the present disclosure is advantageous in providing various light sources for lighting purposes, on-board light sources, light sources for backlights, etc.

The above disclosed subject matter shall be considered illustrative, and not restrictive, and the appended claims are intended to cover all such modifications, enhancements, and other embodiments that fall within the true spirit and scope of the present disclosure. Thus, to the maximum extent allowed by law, the scope of the present disclosure may be determined by the broadest permissible interpretation of the following claims and their equivalents, and shall not be restricted or limited by the foregoing detailed description.

What is claimed is:

1. A method of manufacturing a light emitting device, comprising:
   providing a first resin layer having a light-transmitting portion;
   providing a light-emitting element having a first surface and a second surface that is opposite to the first surface, the light-emitting element including an anode and a cathode at a first surface side of the light-emitting element;
   providing a Zener diode having a third surface, the Zener diode including a first electrically-conductive structure and a second electrically-conductive structure at a third surface side of the Zener diode, wherein, in a plan view, the first electrically-conductive structure and the second electrically-conductive structure are spaced apart from both the anode and the cathode;
   placing the light-emitting element above the light-transmitting portion such that the first surface of the light-emitting element faces away from the first resin layer;
   placing the Zener diode above the first resin layer or the first surface of the light emitting element such that the third surface of the Zener diode faces away from the first resin layer or the first surface of the light-emitting element;
   forming a second resin layer on the first resin layer so as to cover an entirety of the light-emitting element and an entirety of the Zener diode;
   removing a portion of the second resin layer, which comprises grinding the second resin layer from an upper surface side to form a ground surface from which the anode, the cathode, the first electrically-conductive structure, and the second electrically conductive structure are exposed;
   forming a first electrode on the ground surface such that the anode and the first electrically-conductive structure are electrically connected together via the first electrode; and
   forming a second electrode on the ground surface such that the cathode and the second electrically-conductive structure are electrically connected together via the second electrode.

2. The method according to claim 1, wherein:
   in the step of placing the Zener diode above the first resin layer or the first surface of the light-emitting element, the Zener diode is placed above the first surface of the light-emitting element.

3. The method according to claim 1, wherein:
   the step of placing the light-emitting element comprises
   applying an uncured light-transmitting adhesive agent onto the light-transmitting portion, and
   placing the light-emitting element on a region of the light-transmitting portion to which the light-transmitting adhesive agent is applied and curing the light-transmitting adhesive agent to form a light guide portion on at least a portion of a lateral surface of the light emitting element.

4. The method according to claim 1, wherein:
   the Zener diode includes a first terminal and a second terminal at the third surface side,
   a first electrically-conductive member is connected to the first terminal to form the first electrically-conductive structure, and
   a second electrically-conductive member is connected to the second terminal to form the second electrically-conductive structure.

5. The method according to claim 4, wherein:
   the first electrically-conductive member has a structure in which first bumps are stacked, and the second electrically-conductive member has a structure in which second bumps are stacked.

6. The method according to claim 5, wherein:
   in the step of placing the Zener diode above the first resin layer or the first surface of the light-emitting element, an end extremity of the first electrically-conductive member is located at a position higher than a surface of the anode, and an end extremity of the second electrically-conductive member is located at a position higher than the surface of the cathode.

7. The method according to claim 4, wherein:
   the first electrically-conductive member is a first wire one end of which is connected to the first terminal, and the second electrically-conductive member is a second wire one end of which is connected to the second terminal.

8. The method according to claim 7, wherein:
in the step of placing the Zener diode above the first resin layer or the first surface of the light-emitting element, a far end of the first electrically-conductive member is located at a position higher than a surface of the anode, and a far end of the second electrically conductive member is located at a position higher than the surface of the cathode.

9. The method according to claim 4, wherein:
each of the first electrically-conductive member and the second electrically conductive member is in the form of pillar.

10. The method according to claim 9, wherein:
in the step of placing the Zener diode above the first resin layer or the first surface of the light-emitting element, an end extremity of the first electrically-conductive member is located at a position higher than a surface of the anode, and an end extremity of the second electrically-conductive member is located at a position higher than the surface of the cathode.

11. The method according to claim 1, wherein:
the step of providing the first resin layer comprises:
providing a resin substrate,
defining a hole in a portion of the resin substrate, and filling the hole with a first resin composition and curing the first resin composition to form the light-transmitting portion.

12. The method according to claim 11, wherein the first resin composition contains a phosphor.

13. The method according to claim 12, wherein:
the resin substrate is formed of a second resin composition in which a light reflective filler is dispersed.

14. The method according to claim 11, wherein:
the resin substrate is formed of a second resin composition in which a light reflective filler is dispersed.

15. The method according to claim 1, wherein:
each of the first electrically-conductive structure and the second electrically conductive structure is in the form of lead electrode.

16. The method according to claim 15, wherein:
in the step of placing the Zener diode above the first resin layer or the first surface of the light-emitting element, the first electrically-conductive structure has a portion located at a position higher than a surface of the anode, and the second electrically-conductive structure has a portion located at a position higher than the surface of the cathode.

17. The method according to claim 1, wherein:
the Zener diode has a fourth surface that is opposite to the third surface, and,
in the step of placing the Zener diode above the first resin layer or the first surface of the light-emitting element, the Zener diode is disposed above the first resin layer so that the fourth surface of the Zener diode faces a region of the first resin layer where the light-transmitting portion is absent.

18. A method of manufacturing a light emitting device, comprising:
providing a first resin layer having a light-transmitting portion;
providing a light-emitting element having a first surface and a second surface that is opposite to the first surface, the light-emitting element including an anode and a cathode at a first surface side of the light-emitting element;
providing a Zener diode having a third surface, the Zener diode including a first electrically-conductive structure and a second electrically-conductive structure at a third surface side of the Zener diode;
placing the light-emitting element above the light-transmitting portion such that the first surface of the light-emitting element faces away from the first resin layer;
placing the Zener diode above the first surface of the light-emitting element via an adhesive agent such that the third surface of the Zener diode faces away from the first surface of the light-emitting element;
forming a second resin layer on the first resin layer so as to cover an entirety of the light-emitting element and an entirety of the Zener diode;
removing a portion of the second resin layer, which comprises grinding the second resin layer from an upper surface side to form a ground surface from which the anode, the cathode, the first electrically-conductive structure, and the second electrically-conductive structure are exposed;
forming a first electrode on the ground surface such that the anode and the first electrically-conductive structure are electrically connected together via the first electrode; and
forming a second electrode on the ground surface such that the cathode and the second electrically-conductive structure are electrically connected together via the second electrode.

19. A method of manufacturing a light emitting device, comprising:
providing a first resin layer having a light-transmitting portion;
providing a light-emitting element having a first surface and a second surface that is opposite to the first surface, the light-emitting element including an anode and a cathode at a first surface side of the light-emitting element;
providing a Zener diode having a third surface, the Zener diode including a first electrically-conductive structure and a second electrically-conductive structure at a third surface side of the Zener diode;
placing the light-emitting element above the light-transmitting portion such that the first surface of the light-emitting element faces away from the first resin layer;
placing the Zener diode in direct contact with the first resin layer or above the first resin layer via an adhesive agent such that the third surface of the Zener diode faces away from the first resin layer;
forming a second resin layer on the first resin layer so as to cover an entirety of the light-emitting element and an entirety of the Zener diode;
removing a portion of the second resin layer, which comprises grinding the second resin layer from an upper surface side to form a ground surface from which the anode, the cathode, the first electrically-conductive structure, and the second electrically-conductive structure are exposed;
forming a first electrode on the ground surface such that the anode and the first electrically-conductive structure are electrically connected together via the first electrode; and forming a second electrode on the ground surface such that the cathode and the second electrically-conductive structure are electrically connected together via the second electrode.

\* \* \* \* \*